US009812493B2

(12) United States Patent
Yano

(10) Patent No.: US 9,812,493 B2
(45) Date of Patent: Nov. 7, 2017

(54) LIGHTING DEVICE

(71) Applicants: CITIZEN ELECTRONICS CO., LTD., Yamanashi-ken (JP); CITIZEN WATCH CO., LTD., Tokyo (JP)

(72) Inventor: Takakazu Yano, Yamanashi-ken (JP)

(73) Assignees: CITIZEN ELECTRONICS CO., LTD., Yamanashi-Ken (JP); CITIZEN WATCH CO., LTD., Tokyo (JP)

(*) Notice: Subject to any disclaimer, the term of this patent is extended or adjusted under 35 U.S.C. 154(b) by 0 days.

(21) Appl. No.: 14/905,051

(22) PCT Filed: Jul. 14, 2014

(86) PCT No.: PCT/JP2014/003718
§ 371 (c)(1),
(2) Date: Jan. 14, 2016

(87) PCT Pub. No.: WO2015/008476
PCT Pub. Date: Jan. 22, 2015

(65) Prior Publication Data
US 2016/0155775 A1 Jun. 2, 2016

(30) Foreign Application Priority Data

Jul. 18, 2013 (JP) ................................. 2013-149071

(51) Int. Cl.
H01L 27/15 (2006.01)
H01L 33/50 (2010.01)
(Continued)

(52) U.S. Cl.
CPC .......... H01L 27/15 (2013.01); H01L 25/0753 (2013.01); H01L 33/505 (2013.01);
(Continued)

(58) Field of Classification Search
None
See application file for complete search history.

(56) References Cited

U.S. PATENT DOCUMENTS 6,234,648 B1 5/2001 Börner et al.
2004/0021629 A1 2/2004 Sasuga et al.
(Continued)

FOREIGN PATENT DOCUMENTS

EP 2 555 262 2/2013
JP 2004-055772 2/2004
(Continued)

OTHER PUBLICATIONS

International Search Report issued Oct. 1, 2014 in International (PCT) Application No. PCT/JP2014/003718.
(Continued)

Primary Examiner — Khaja Ahmad
(74) Attorney, Agent, or Firm — Wenderoth, Lind & Ponack, L.L.P.

(57) ABSTRACT

In a first aspect of the present invention, a lighting device (100) includes a first light emitter (1) that includes a first light-emitting element (10) with a p-n junction (10g), and a first side cover (11) partly covering a peripheral side surface (10c-10f) of the first light-emitting element (10); a second light emitter (2) that includes a second light-emitting element (20) with a p-n junction (20g) and a second side cover (21) partly covering a peripheral side surface (20c-20f) of the second light-emitting element (20), and the first light emitter (1) and the second light emitter (2) are disposed to face each other at uncovered side portions (10c, 20c) that are uncovered by the first side cover (11) and the second side cover (21). It is disclosed that the first side cover (11) covers a quarter or more area of the peripheral side surface (10c-10f) of the first light-emitting element (10).

18 Claims, 17 Drawing Sheets

(51) Int. Cl.
*H01L 33/56* (2010.01)
*H01L 33/58* (2010.01)
*H01L 25/075* (2006.01)
*H01L 33/44* (2010.01)
*H01L 33/60* (2010.01)
*F21V 3/04* (2006.01)
*F21Y 105/12* (2016.01)
*F21Y 105/10* (2016.01)
*F21K 9/232* (2016.01)
*F21Y 103/10* (2016.01)
*F21Y 115/10* (2016.01)
*F21Y 113/13* (2016.01)

(52) U.S. Cl.
CPC .............. *H01L 33/56* (2013.01); *H01L 33/58* (2013.01); *F21K 9/232* (2016.08); *F21V 3/0418* (2013.01); *F21V 3/0436* (2013.01); *F21Y 2103/10* (2016.08); *F21Y 2105/10* (2016.08); *F21Y 2105/12* (2016.08); *F21Y 2113/13* (2016.08); *F21Y 2115/10* (2016.08); *H01L 33/44* (2013.01); *H01L 33/60* (2013.01); *H01L 2224/32225* (2013.01); *H01L 2224/48091* (2013.01); *H01L 2224/48227* (2013.01); *H01L 2224/73265* (2013.01)

(56) References Cited

U.S. PATENT DOCUMENTS

| | | |
|---|---|---|
| 2006/0197098 A1 | 9/2006 | Aihara |
| 2009/0295266 A1 | 12/2009 | Ramer et al. |
| 2010/0320479 A1* | 12/2010 | Minato ............... H01L 33/56 257/88 |
| 2011/0051397 A1* | 3/2011 | Bae ................... G02F 1/133603 362/97.1 |
| 2011/0235325 A1 | 9/2011 | Ramer et al. |
| 2012/0037940 A1 | 2/2012 | Ishimori |
| 2012/0211774 A1 | 8/2012 | Harada |
| 2012/0236582 A1* | 9/2012 | Waragaya ............. H01L 33/507 362/510 |
| 2012/0327656 A1 | 12/2012 | Ramer et al. |
| 2013/0033169 A1 | 2/2013 | Ito et al. |
| 2014/0191655 A1 | 7/2014 | Kasakura et al. |

FOREIGN PATENT DOCUMENTS

| | | |
|---|---|---|
| JP | 2005-153606 | 6/2005 |
| JP | 2006-245443 | 9/2006 |
| JP | 2009-099926 | 5/2009 |
| JP | 2009-130105 | 6/2009 |
| JP | 2011-222126 | 11/2011 |
| JP | 2012-004392 | 1/2012 |
| JP | 2013-42099 | 2/2013 |
| WO | WO2010/119934 | 10/2010 |

OTHER PUBLICATIONS

Written Opinion of the International Searching Authority issued Oct. 1, 2014 in International (PCT) Application No. PCT/JP2014/003718.

Japanese Notification of Reasons for Refusal dated Jun. 19, 2017 in corresponding Japanese Patent Application No. 2013-149071 with machine English translation.

Chinese Office Action dated Sep. 25, 2017 in corresponding Chinese Patent Application No. 201480040846.6 with English translation.

* cited by examiner

LIGHTING DEVICE

TECHNICAL FIELD

The present invention relates to a lighting device, and also relates to a lighting device including two or more light emitters.

BACKGROUND ART

It is laid open to the public that a light-emitting diode device includes a white light-emitting diode device that includes a blue light-emitting diode and a filter including a phosphor, and a red light-emitting diode. It is also disclosed that the blue light-emitting diode and the red light-emitting diode are mounted on a substrate and sealed by a transparent resin including a phosphor (For reference, see Japanese Unexamined Patent Application Publication No. 2004-055772).

Also, it is laid open to the public that a lighting device includes a blue light-emitting diode, a green light-emitting diode, a yellow phosphor that can be excited by blue light from the blue light-emitting diode, and a red phosphor that can be excited by green light from the green light-emitting diode (For reference, see Japanese Unexamined Patent Application Publication No. 2006-245443).

Furthermore, there are publications disclosing a lighting device that includes light-emitting elements arranged in a reflection cup. For example, it is laid open to the public that a lighting system includes at least two light-emitting diodes arranged on a holder and further includes a screen provided with (diffusedly reflecting) reflection means and conversion means (For reference, see U.S. Pat. No. 6,234,648).

Also, it is laid open to the public that a lighting device for a vehicle including two types of white LEDs that are arranged alternately in a matrix on a substrate, a case including a light-reflection surface surrounding the white LEDs, and a light-diffusion film arranged above the white LEDs to make light intensity variations less visible and to improve the color mixture of light emitted from the white LEDs (For reference, see Japanese Unexamined Patent Application Publication No. 2005-153606).

CITATION LIST

Patent Literature

Japanese Unexamined Patent Application Publication No. 2004-055772.
Japanese Unexamined Patent Application Publication No. 2006-245443.
U.S. Pat. No. 6,234,648.
Japanese Unexamined Patent Application Publication No. 2005-153606.

SUMMARY OF INVENTION

Solution To Problem

In a first aspect of the present invention, a lighting device includes a first light emitter including a first light-emitting element with a p-n junction and a first side cover partly covering a peripheral side surface of the first light-emitting element, a second light emitter including a second light-emitting element with a p-n junction and a second side cover partly covering a peripheral side surface of the second light-emitting element, the first light emitter and the second light emitter being disposed to face each other at uncovered side portions that are uncovered by the first side cover and the second side cover. Since the first side cover of the first light emitter and the second side cover of the second light emitter are respectively arranged on the light emitters, it is possible to arrange the light emitters in a flexible manner, for example, arranging two or more light emitters in a straight line, in a non-linear line, in a matrix, and/or a combination thereof, for example, It is disclosed that the first light emitter and the second light emitter may be configured to emit light with emission spectrum different from each other. It is possible to achieve a color mixture of light with emission spectrum different from each other from the first light emitter and the second light emitter.

It is also disclosed that the first side cover may cover a quarter or more area of the peripheral side surface of the first light-emitting element. Furthermore, it is disclosed that the second side cover may cover a quarter or more area of the peripheral side surface of the second light-emitting element. It is disclosed that the first side cover and the second side cover may be made of white resin.

It is disclosed that the first light emitter further includes a first light-transmitting layer including a phosphor that can be excited by light from the first light-emitting element, and the first light-transmitting layer covers at least an upper surface of the first light-emitting element above a light-emitting surface of the p-n junction of the first light-emitting element and the uncovered side portion that is uncovered by the first side cover.

Also, it is disclosed that the second light emitter may include a second light-transmitting layer including a phosphor that can be excited by light from the second light-emitting element. The second light-transmitting layer may cover at least an upper surface of the second light-emitting element above a light-emitting surface of the p-n junction of the second light-emitting element and the uncovered side portion that is uncovered by the second side cover.

Furthermore, it is disclosed that the first light emitter may include a substrate on that the first light-emitting element is electrically mounted and a first light-transmitting layer including a phosphor that can be excited by light from the first light-emitting element, and the first light-transmitting layer is arranged on the substrate to seal the first light-emitting element. It is disclosed that the first side cover partly covering the peripheral side surface of the first light-emitting element is disposed in contact with a part of peripheral side surface of the first light-transmitting layer and partly covers the peripheral side surface of the first light-transmitting layer.

It is disclosed that the second light emitter may include a substrate on that the first light-emitting element is electrically mounted and a second light-transmitting layer including a phosphor that can be excited by light from the second light-emitting element, and the second light-transmitting layer is arranged on the substrate to seal the second light-emitting element. It is disclosed that the second side cover partly covering the peripheral side surface of the second light-emitting element is disposed in contact with a part of peripheral side surface of the second light-transmitting layer and partly covers the peripheral side surface of the second light-transmitting layer.

In a second aspect of the present invention, it is disclosed that a first side cover at a position opposite to uncovered side portion that is uncovered by a first side cover may be greater in height from an upper surface of a substrate than a first light-transmitting layer from an upper surface of a substrate at a position adjacent to the uncovered side portion that is uncovered by the first side cover.

In a third aspect of the present invention, it is disclosed that a first side cover of a first light emitter can be greater in height than a second side cover of a second light emitter.

In a fourth aspect of the present invention, it is disclosed that a first pair including the first light emitter and the second light emitter and a second pair including the first light emitter and the second light emitter are arranged one after another in a line. It is also disclosed that the first pair and the second pair are arranged side by side.

In a fifth aspect of the present invention, a lighting device includes light emitters arranged in an area, a first light emitter of the light emitters including a first light-emitting element and a first side cover partly covering a peripheral side surface of the first light-emitting element, and the first side cover of the first light emitter covering a quarter or more area of the peripheral side surface of the first light emitting element, a second light emitter of the light emitters including a second light-emitting element and a second side cover partly covering a peripheral side surface of the second light-emitting element, and the second side cover of the second light emitter covering a quarter or more area of the peripheral side surface of the second light emitting element.

It is also disclosed that the lighting device may further include a third light emitter of the light emitters, and the third light emitter may be positioned inside of positions of the first light emitter and the second light emitter in the area.

Furthermore, it is disclosed that the third light emitter is configured to emit light radially from the peripheral side surface of the third light emitter.

It is disclosed that light from the first light emitter, light from the second light emitter, and light from the third light emitter are configured to be directed upward above the area in that the light emitters are arranged.

It is also disclosed that the first light emitter and the third light emitter are configured to emit light with emission spectrum similar to each other.

DESCRIPTION OF EMBODIMENTS

As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising," "includes", "including", "has" and/or "having" when used herein, specify the presence of stated features, integers, elements, components, portion of an element, and/or groups but do not preclude the presence or addition of one or more other features, integers, elements, components, portions, and/or groups thereof.

Relative terms such as "below" or "above" or "upper" or "lower" or "upward" or "downward" may be used herein to describe a relationship of one element, portion, surface, area, or direction to another element, portion, surface, area, or direction as illustrated in the figures. It will be understood that these terms are intended to encompass different orientations of a device in addition to the orientation depicted in the figures.

Embodiments of the invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Embodiments of the invention are described with reference to drawings included herewith. Same and/or similar reference numbers refer to same and/or similar structures throughout. It should be noted that the drawings are schematic in nature.

Figure 1:
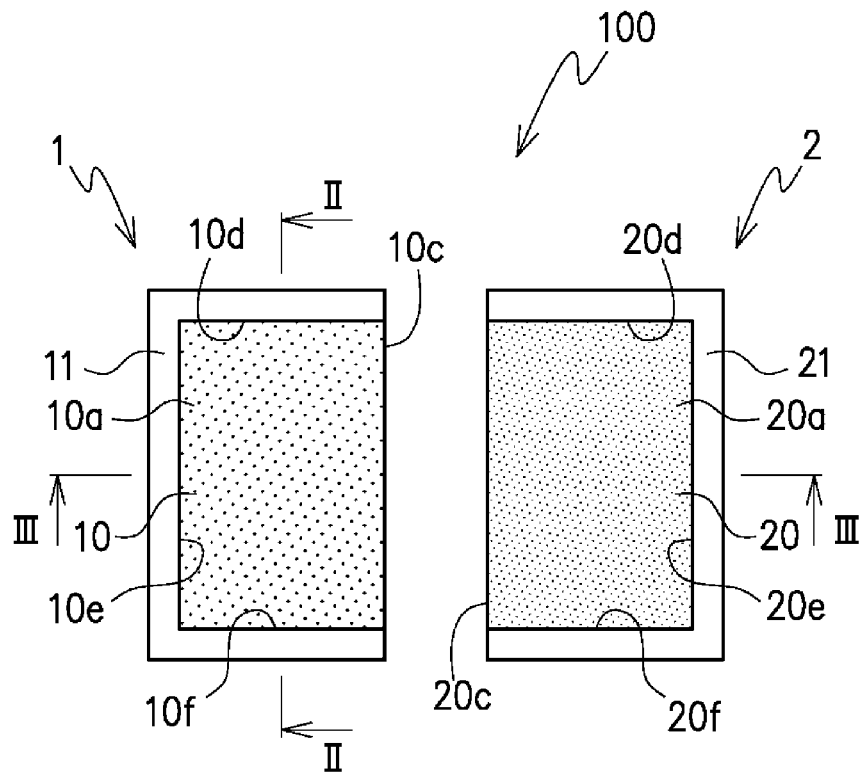
FIG. 1 is a top plan view of a lighting device according to a first embodiment of the present invention.

FIG. 1 is a top plan view of a lighting device 100 according to a first embodiment of the present invention. The lighting device 100 includes a first light emitter 1 that includes a first light-emitting element 10 with a p-n junction 10g and a first side cover 11 partly covering a peripheral side surface 10c-10f of the first light-emitting element 10, and a second light emitter 2 that includes a second light-emitting element 20 with a p-n junction 20g and a second side cover 21 partly covering a peripheral side surface 20c-20f of the second light-emitting element 20.

The first light emitter 1 and the second light emitter 2 are disposed to face each other at uncovered side portions 10c, 20c that are uncovered by the first side cover 11 and the second side cover 21. In this embodiment, the uncovered side portion 10c of the first light emitter 1 and the uncovered side portion 20c of the second light emitter 2 are adjacently disposed to face each other. The shape of light emitter may be substantially cubic or rectangular parallel piped, for example.

Figure 3:
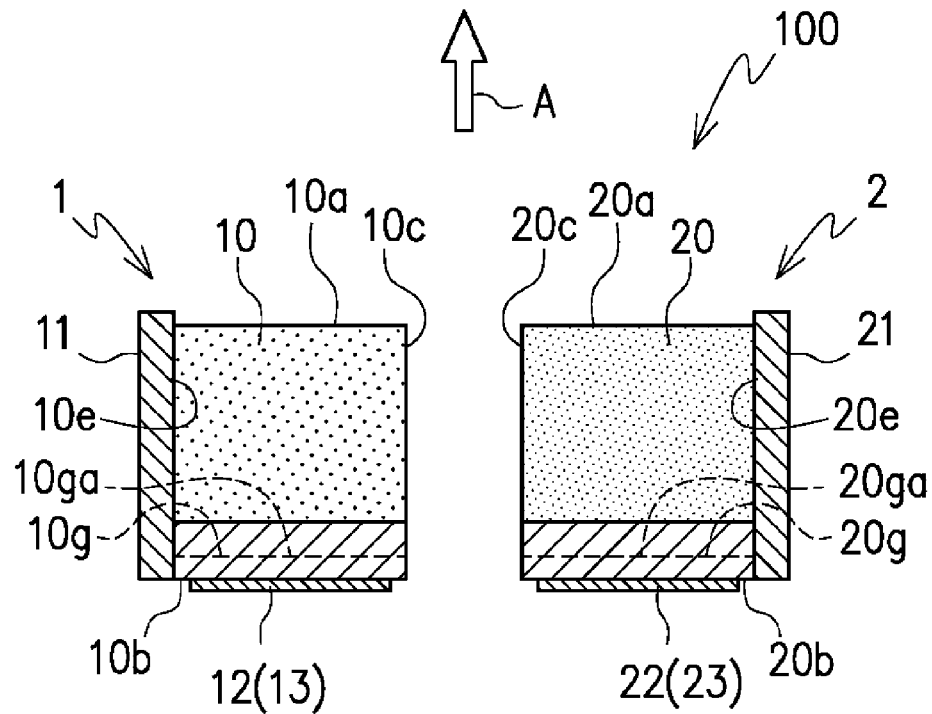
FIG. 3 is a cross-sectional view of a first light emitter and a second light emitter of the lighting device taken along a line III-III shown in FIG. 1.

Accordingly, light from the first light emitter 1 with the first side cover 11 and the second light emitter 2 with the second side cover 21 can be mixed efficiently as upward light toward a direction shown as an arrow A in FIG. 3. It is also possible to arrange a first light emitter and a second light emitter to be slightly shifted to face each other at uncovered side portions. The word "face" includes a situation that two or more light emitters face oppositely one another at uncovered side portions, and a situation that two or more light emitters partly face one another at uncovered side portions.

A light-emitting surface 10ga of the p-n junction 10g of the first light-emitting element 10 faces an upper surface 10a of the first light-emitting element 10. A light-emitting surface 20ga of the p-n junction 20g of the second light-emitting element 20 faces an upper surface 20a of the second light-emitting element 20. In this embodiment, p-contact electrode 12 and n-contact electrode 13 of the first light-emitting element 10 are positioned at a lower surface 10b of the first light-emitting element 10. The upper surface 10a and the lower surface 10b of the first light-emitting element 10 are opposite to each other. The peripheral side surface 10c-10f of the first light-emitting element 10 extends between edges of the upper surface 10a and the lower surface 10b of the first light-emitting element 10. Also, p-contact electrode 22 and n-contact electrode 23 of the second light-emitting element 20 are positioned at a lower surface 20b of the second light-emitting element 20. The peripheral side surface 20c-20f of the second light-emitting element 20 extends between edges of the upper surface 20a and the lower surface 20b of the second light-emitting element 20.

The first side cover 11 covers a quarter or more area of the peripheral side surface 10c-10f of the first light-emitting element 10. In this embodiment, the first side cover 11 covers three quarters of the peripheral side surface 10c-10f of the first light-emitting element 10. For more details, the first light-emitting element 10 of the first light emitter 1 has four side surfaces 10c, 10d, 10e, 10f as the peripheral side surface 10c-10f, and three side surfaces 10d, 10e, 10f of the four side surfaces 10c, 10d, 10e, 10f are covered by the first side cover 11. In this embodiment, the first side cover 11 is directly arranged on the first light-emitting element 10.

Also, the second side cover 21 covers a quarter or more area of the peripheral side surface 20c-20f of the second light-emitting element 20. In this embodiment, the second side cover 21 covers three quarters of the peripheral side surface 20c-20f of the second light-emitting element 20. For more details, the second light-emitting element 20 of the second light emitter 2 has four side surfaces 20c, 20d, 20e, 20f as a peripheral side surface 20c-20f, and three side surfaces 20d, 20e, 20f are covered by the second side cover 21. In this embodiment, the second side cover 21 is directly arranged on the second light-emitting element 20.

In this embodiment, a first side surface 10c as an uncovered side portion of the four side surfaces 10c, 10d, 10e, 10f of the first light emitter 1 and a first side surface 20c as an uncovered side portion of the four side surfaces 20c, 20d, 20e, 20f of the second light emitter 2 are disposed to face each other. The first light emitter 1 in this embodiment is configured to emit light from the upper surface 10a and the uncovered side portion 10c of the first light-emitting element 10. The second light emitter 2 in this embodiment is configured to emit light from the upper surface 20a and the uncovered side portion 20c of the second light-emitting element 20.

The first light emitter 1 and the second light emitter 2 may be configured to emit light with emission spectrum different from each other.

For example, light with emission spectrum range 630 nm-780 nm may appear to be red light, light with emission spectrum range 590 nm-630 nm may appear to be red-yellow (orange) light, light with emission spectrum range 560 nm-590 nm may appear to be yellow light.

Also, light with emission spectrum range 490 nm-560 nm may appear to be green light, light with emission spectrum range 450 nm-490 nm may appear to be blue light, and light with emission spectrum range 400 nm-450 nm may appear to be near ultraviolet light. Light with emission spectrum range 10 nm-400 nm may be categorized as ultraviolet light.

For example, a first light emitter configured to emit mixed light of blue light and yellow light can be used with a second light emitter. The second light emitter configured to emit mixed light of ultraviolet light, red light, green light, and blue light may be used, for example. A combination of first light emitter and second light emitter is not limited to this example. Color-rendering properties of light can be enhanced and/or improved with a combination of one or more phosphors and/or one or more light-emitting elements.

Furthermore, the lighting device may include at least one drive circuit that is configured to supply current to the first light emitter and the second light emitter simultaneously and/or separately. Accordingly, it is possible for the lighting device to achieve a dimmer and/or color control of light from the lighting device also by altering amount of current that flows in the first light emitter and/or the second light emitter, for example. Considering a combination of two or more light emitters including one or more light-emitting element from various choices of colors of light-emitting elements and one or more phosphor from various choices of colors of light from the phosphor when being excited by light from light-emitting element, and a possibility of current amount alteration, a lighting device with desirable and/or changeable color rendering property is able to be offered.

Side cover including the first side cover 11 and the second side cover 22 is configured to shield and/or reflect light. The side cover may include resin and light-reflective particle. The side cover may be made of white-colored resin. The resin may be selected from silicone resin, epoxy resin, acrylic resin, and/or equivalent material as a solvent. The light-reflective particle may be selected from particles of titanium oxide (TiO$_2$), silicon dioxide (SiO$_2$), zirconium dioxide (ZrO$_2$), aluminum oxide (Al$_2$O$_3$), and/or boron nitride. For example, the side cover may be made of silicone resin including titanium oxide (TiO$_2$) particle. Also, the side cover partly covering a peripheral side surface of light-emitting element may have a function to reflect light inward toward the light-emitting element to enhance light-emitting efficiency from a light emitter that includes the side cover and the light-emitting element. For example, the side cover may be opaque. The side cover may be formed by coating, potting, and/or molding the resin including the light-reflective particle.

Since a side cover can be directly attached to a light emitter, it is possible to offer a great flexibility when the number of light emitters to be arranged is required to be increased and/or changed. Also, it is possible to offer a great flexibility when a combination and/or arrangement of two or more light emitters for mixed light are required to be changed. Furthermore, size and/or height of a side cover of a light emitter can be determined, considering the position of the light emitter in a pair, in a group, and/or in an area in that light emitters are arranged.

Figure 2:
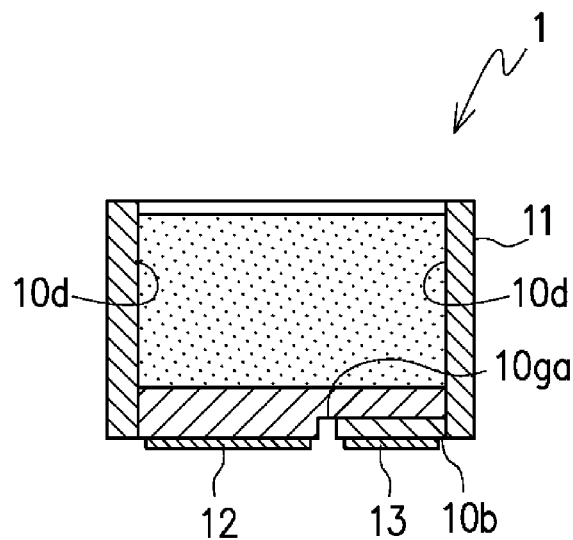
FIG. 2 is a cross-sectional view of a first light emitter of the lighting device taken along a line II-II shown in FIG. 1.

FIG. 2 is a cross-sectional view of a first light emitter of the lighting device taken along a line II-II shown in FIG. 1. In this embodiment, the first light-emitting element 10 may be a light-emitting diode (LED) element including p-contact electrode 12 and n-contact electrode 13 positioned at the lower surface 10*b* of the first light-emitting element 10 as a bare chip. The bare chip may be a wafer-level chip. The p-contact electrode 12 and the n-contact electrode 13 positioned adjacent to the lower surface 10*b* of the first light-emitting element 10 of the first emitter 1 may be electrically connected to a substrate and/or motherboard (that is not shown in FIG. 1 and FIG. 2) through bumps and/or solder.

FIG. 3 is a cross-sectional view of the first light emitter 1 and the second light emitter 2 of the lighting device 100 taken along the line III-III shown in FIG. 1.

Figure 4:
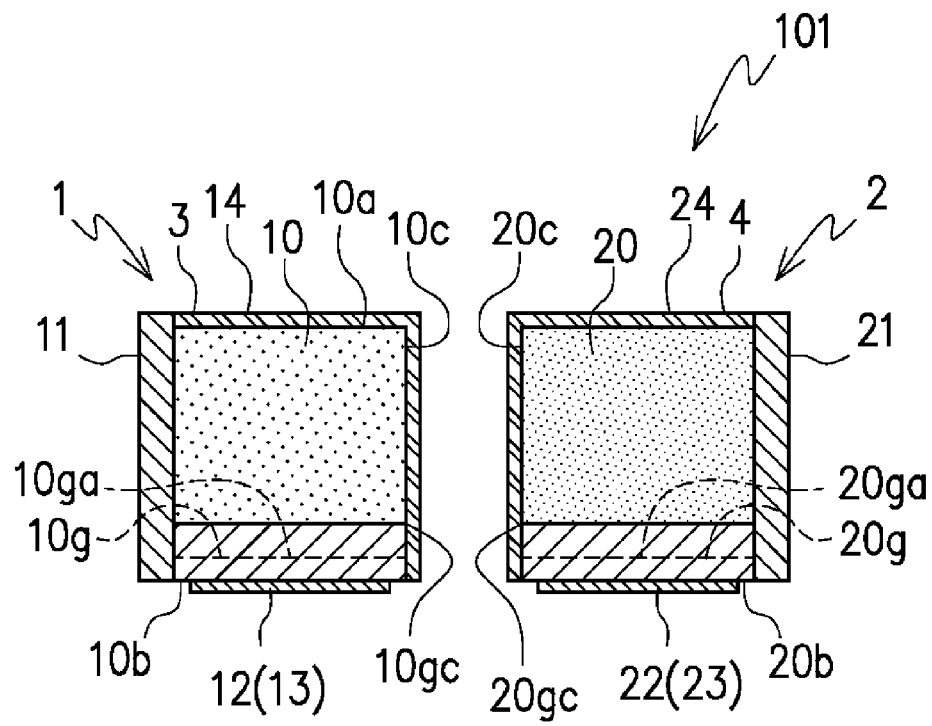
FIG. 4 is a cross-sectional view of a first light emitter and a second light emitter of a lighting device according to a second embodiment of the present invention.

FIG. 4 is a cross-sectional view of a first light emitter and a second light emitter of a lighting device according to a second embodiment of the present invention. The second embodiment of the present invention is a variation of the first embodiment. Different from the first embodiment, the first light emitter 1 of the lighting device 101 according to the second embodiment includes a first light-transmitting layer 14 including a phosphor 3. The phosphor 3 included in the first light-transmitting layer 14 can be excited by light from the first light-emitting element 10. In this embodiment, the first light-transmitting layer 14 covers the upper surface 10*a* of the first light-emitting element 10 and is positioned above the light-emitting surface 10*ga* of the p-n junction 10*g*. The first light-transmitting layer 14 also covers the uncovered side portion 10*c* that is uncovered by the first side cover 11. The first light-transmitting layer 14 also may cover the lower surface 10*b* of the first light-emitting element 10. The first light-transmitting layer 14 including the phosphor 3 may cover whole surface of the first light-emitting element 10 except p-contact electrode 12 and n-contact electrode 13 that are positioned at the lower surface 10*b* of the first light-emitting element 10 as a variation. If the light-emitting element is a blue light-emitting element, a near-ultraviolet light-emitting element, or an ultraviolet light-emitting element, for example, direct light from the light-emitting element may deteriorate the quality of a member adjacently arranged to the light-emitting element. Accordingly, if the whole surface except an electrical connection portion of the light-emitting element is covered by the light-transmitting layer including a phosphor that is able to convert light from the light-emitting element to less detrimental light, it is possible to prevent the adjacently arranged member to the light-emitting element from being deteriorated by exposure of direct light from the light-emitting element. Accordingly, it is possible that the light-transmitting layer arranged on the lower surface of the light-emitting element may include more light-reflective particles than the light-transmitting layer arranged on the upper surface of the light-emitting element.

In this variation, the first side cover 11 is arranged in contact with the first light-transmitting layer 14 including the phosphor and covers a part of the four side surfaces 10*c*, 10*d*, 10*e*, 10*f* of the first light-emitting element 10 with the first light-transmitting layer 14 being interposed between the first side cover 11 and the part of the four side surfaces 10*c*, 10*d*, 10*e*, 10*f* of the first light-emitting element 10.

The first light-emitting element 10 of the first light emitter 1 may be blue light-emitting element with emission spectrum range 450 nm-490 nm, the second light-emitting element of the second light emitter 2 may be green light-emitting element with emission spectrum range 490 nm-560 nm, for example. The phosphor 3 included in the first light-transmitting layer 14 may be YAG (yttrium aluminum garnet) phosphor that can be excited by blue light emitted from the blue light-emitting element 10 and emit yellow light with emission spectrum range 560 nm-590 nm, for example. Accordingly, light from the lighting device 101 can appear to be white light as mixed light.

Furthermore, the first light emitter 1 may be near ultra-violet light-emitting element with emission spectrum range 400 nm-450 nm, for example. The phosphor 3 included in the first light-transmitting layer 14 may include at least one of red phosphor that can be excited to emit red light with emission spectrum range 630 nm-780 nm, green phosphor that can be excited to emit green light with emission spectrum range 490 nm-560 nm, and blue phosphor that can be excited to emit blue light with emission spectrum range 450 nm-490 nm.

Also, the second light emitter 2 of the lighting device 101 according to the second embodiment also can include a second light-transmitting layer 24 including a phosphor 4. The second light-transmitting layer 24 also may be arranged on the second light-emitting element 20, similarly to the first light-transmitting layer 14 arranged on the first light-emitting element 10 as explained in the above. The second light-transmitting layer 24 including the phosphor 4 may cover whole surface of the second light-emitting element 20 except p-contact electrode 22 and n-contact electrode 23 that are positioned at the lower surface 20*b* of the second light-emitting element 20 as a variation. The second side cover 21 is arranged in contact with the second light-transmitting layer 24 including the phosphor 4 and covers a part of the four side surfaces 20*c*, 20*d*, 20*e*, 20*f* of the second light-emitting element 20 with the second light-transmitting layer 24 being interposed between the second side cover 21 and the part of the four side surfaces 20*c*, 20*d*, 20*e*, 20*f* of the second light-emitting element 20.

For example, a second light-emitting element 20 of the second light emitter 2 may be blue light-emitting element that is able to emit blue light with emission spectrum range 450 nm-490 nm when electrical current is applied, and the phosphor 4 may be yellow phosphor that is able to be excited by the blue light to emit yellow light with emission spectrum range 560 nm-590 nm. Accordingly color-rendering properties of light from a lighting device can be enhanced and/or improved with a combination of two phosphors that can emit light with emission spectrum range different from each other and two light emitters that can emit light with emission spectrum range different from each other.

Furthermore, it is possible to enhance and/or improve color-rendering properties of light with a combination of two or more light emitters configured to emit spectrum range of light different from each other and/or with a combination of two or more light emitters that are configured to emit light with emission spectrum range similar to each other of the light emitters. Accordingly various combinations of light-emitting elements and phosphor(s) are available.

As an embodiment, a lighting device may include a first light emitter that includes a blue and/or ultraviolet light-emitting element and a first light-transmitting layer containing a YAG phosphor, and a second light emitter that includes a blue and/or light-emitting element to emit bluish white light amber white light including red color component. The at least one third light emitter may be positioned at a central section of the area. Furthermore, the lighting device may include one or more drive circuits that are configured to activate the at least a third light emitter separately from the first light emitter and the second light emitter.

By altering amount of current that flows in the third light emitter, by altering amount of current that flows in other light emitters, and/or by a combination of alterations, the lighting device may achieve a dimmer and/or color control of light from the lighting device.

Figure 5:
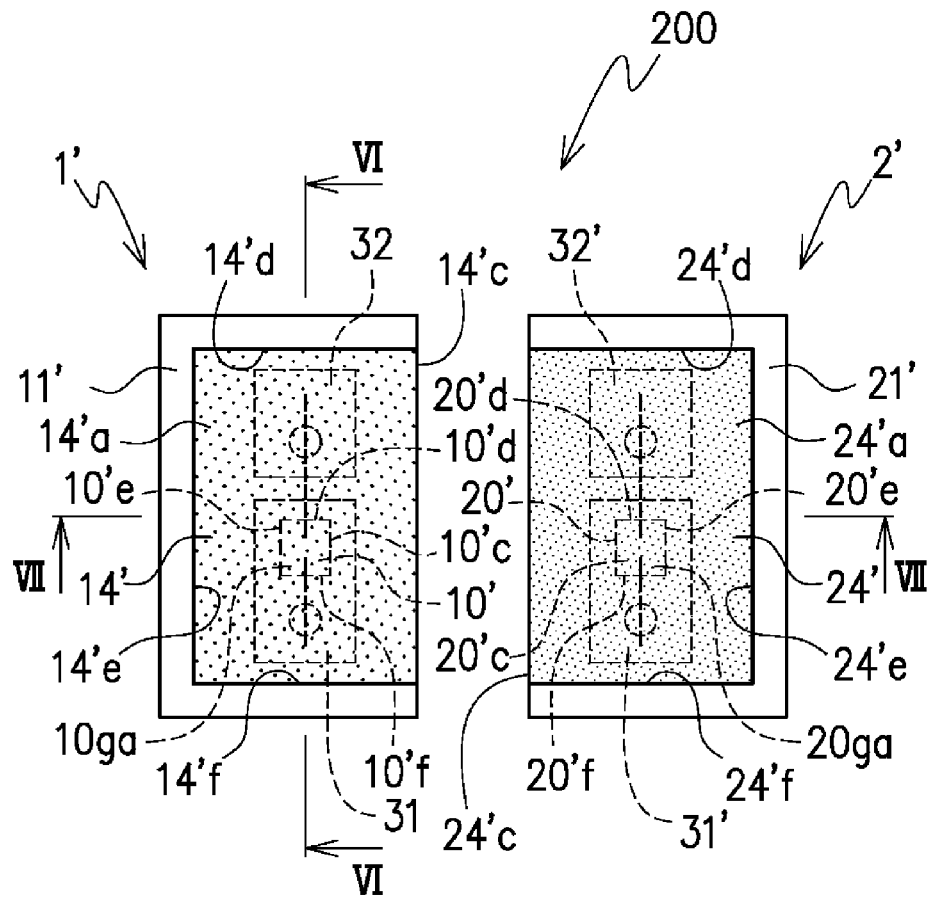
FIG. 5 is a top plan view of a lighting device according to a third embodiment of the present invention.

FIG. 5 shows a top plan view of a lighting device according to a third embodiment of the present invention. The lighting device 200 includes a first light emitter 1' that includes a first light-emitting element 10' with a p-n junction 10'g and a first side cover 11' partly covering a peripheral side surface 10'c-10'f of the first light-emitting element 10', and a second light emitter 2' that includes a second light-emitting element 20' with a p-n junction 20'g and a second side cover 21' partly covering a peripheral side surface 20'c-20'f of the second light-emitting element 20'. The first light emitter 1' and the second light emitter 2' are configured to emit light with emission spectrum range different from each other and adjacently positioned to face each other at uncovered side portions 10'c, 20'c that are uncovered by the first side cover 11' and the second side cover 21'.

In this embodiment, the first side cover 11' spaced from the first light-emitting element 10' by a first light-transmitting layer 14'partly covers the peripheral side surface 10'c-10'f of the first light-emitting element 10'. Also, the second side cover 21' spaced from the second light-emitting element 20' by a second light-transmitting layer 24'partly covers the peripheral side surface 20'c-20'f of the second light-emitting element 20'.

If two or more phosphors such as yellow phosphor and red phosphor are included in a light-transmitting layer sealing a light-emitting element, there is a possibility that light from the light-emitting element may hit both the yellow phosphor and the red phosphor. This may cause light from the light-emitting element being absorbed on different color phosphors two or more times in vain.

However, in a lighting device shown in FIG. 5, since the first light emitter 1' and the second light emitter 2' are separately arranged to face each other, it is possible to make the first light-transmitting layer 14' and the second light-transmitting layer 24' as follows: the first light-transmitting layer 14' contains YAG phosphor as yellow phosphor, and the second light-transmitting layer 24' contains CASN and/or SCASN as red phosphor, for example. CASN and SCASN are known as red phosphors whose general formula is $CaAlSiN_3$:Eu etc. Accordingly, light emitted from the first light-emitting element 10' is partly emitted through the first light-transmitting layer 14' and partly excited by YAG phosphor in the first light-transmitting layer 14'. Also, light emitted from the second light-emitting element 20' is partly emitted through the second light-transmitting layer 24' and partly excited by red phosphor in the second light-transmitting layer 24'. It is possible to avoid further light absorption by a different-color phosphor. Consequently, it is possible to achieve a lighting device with a better luminance efficiency than a lighting device in which YAG phosphor and red phosphor are included in a single light-transmitting layer.

Figure 6:
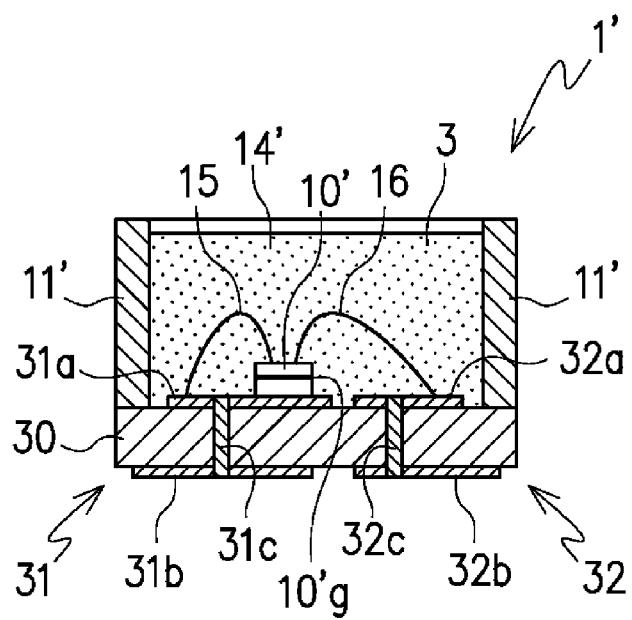
FIG. 6 is a cross-sectional view of a first light emitter of the lighting device taken along a line VI-VI shown in FIG. 5.
Figure 7:
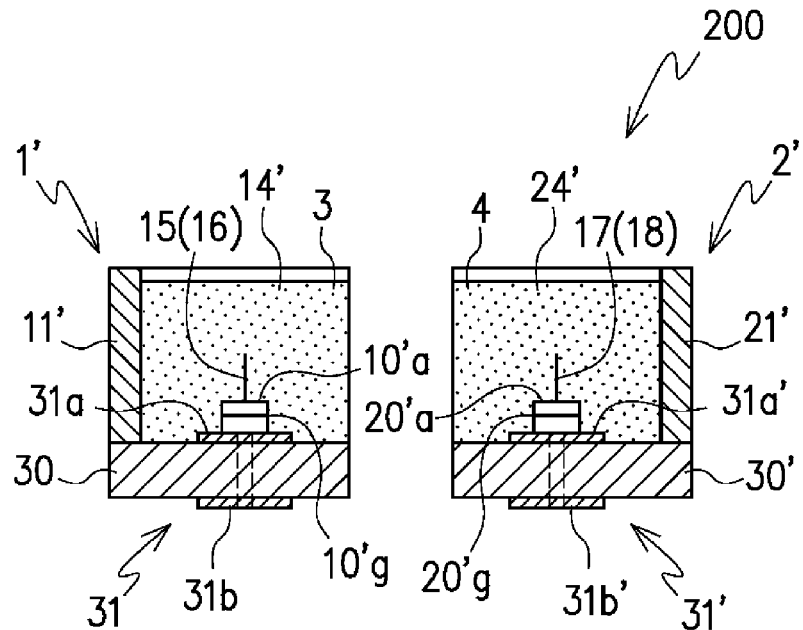
FIG. 7 is a cross-sectional view of the lighting device taken along a line VII-VII shown in FIG. 5.

FIG. 6 is a cross-sectional view of the first light emitter 1' of the lighting device taken along a line VI-VI shown in FIG. 5, and FIG. 7 is a cross-sectional view of the lighting device taken along a line VII-VII shown in FIG. 5. In the third embodiment, the first light emitter 1' further includes a substrate 30 on that the first light-emitting element 10' is electrically mounted, and the second light emitter 2' further includes a substrate 30' on that the second light-emitting element 20' is electrically mounted. The substrate 30 (30') may include a first electrode 31 (31') and a second electrode 32 (32') as a pair of electrodes. The first electrode 31 (31') may include a first upper electrode 31a (31a') arranged on an upper surface of the substrate 30 (30') and a first lower electrode 31b (31b') arranged on a lower surface of the substrate 30 (30'). The first upper electrode 31a (31a') and the first lower electrode 31b (31b') may be electrically connected by a first through-hole 31c (31c') arranged in the substrate 30 (30'). Also, the second electrode 32 (32') may include a second upper electrode 32a (32a') arranged on the upper surface of the substrate 30 (30') and a second lower electrode 32b (32b') arranged on the lower surface of the substrate 30 (30'). The second upper electrode 32a (32a') and the second lower electrode 32b (32b') may be electrically connected by a second through-hole 32c (32c') arranged in the substrate 30 (30'). FIG. 6 shows the cross sectional view of the first light emitter, and the cross sectional view of the second light emitter is omitted, because the second light emitter can have the same electrical configuration as the first light emitter has, as explained above.

In this embodiment, the first light-emitting element 10' includes a p-contact electrode and n-contact electrode that are adjacent to an upper surface 10'a of the first light-emitting element 10'. The first light-emitting element 10' may be arranged on the first upper electrode 31a. The p-contact electrode of the first light-emitting element 10' can be electrically connected to the first upper electrode 31a by a metal wire 15, and the n-contact electrode of the first light-emitting element 10'can be electrically connected to the second upper electrode 32a by a metal wire 16. In this embodiment, the second light-emitting element 20' includes a p-contact electrode and n-contact electrode that are adjacent to an upper surface 20'a of the second light-emitting element 20'. The second light-emitting element 20' may be arranged on the first upper electrode 31a'. The p-contact electrode of the second light-emitting element 20' can be electrically connected to the first upper electrode 31a' by a metal wire 17, and the n-contact electrode of the second light-emitting element 20' can be electrically connected to the second upper electrode 32a' by a metal wire 18. Of course, p-contact electrode and n-contact electrode can be positioned adjacent to a lower surface of a light-emitting element 10' (20') and electrically connected by bumps and/or soldering, instead of the use of metal wires 15, 16 (17, 18) to first and second upper electrodes 31a, 32a (31a', 32a') that are arranged on the substrate 30 (30').

In this embodiment, the first side cover 11' spaced from the first light-emitting element 10' by a first light-transmitting layer 14'partly covers the peripheral side surface 10'c-10'f of the first light-emitting element 10'. The first side cover 11' covers a quarter or more area of the peripheral side surface 10'c-10'f of the first light-emitting element 10'. For more details, the first emitter 1' of the lighting device 200 includes the first light-transmitting layer 14' that includes a phosphor 3 that can be excited by light from the first light-emitting element 10'. The first light-transmitting layer 14 is arranged on the substrate 30 to seal the first light-emitting element 10'. In this embodiment, the first side cover 11' that partly covers the peripheral side surface 10'c-10'f of the first light-emitting element 10 is disposed in contact with a part of peripheral side surface 14'c-14'f of the first light-transmitting layer 14' and partly covers the peripheral side surface 14'c-14'f of the first light-transmitting layer 14 with an uncovered portion 14c that is uncovered by the first side cover 11'. The first side cover 11' is arranged to cover three sides of the peripheral side surface 14'c-14'f with an uncovered side portion 14'c that is uncovered by the first side cover 11'. The uncovered side portion 10'c of the first light-emitting element 10' faces the uncovered side portion 14'c of the first light-transmitting layer 14'. The first light-transmitting layer 14' further includes an upper surface 14'a that is located above the light-emitting surface 10ga of the first light-emitting element 10'.

Also, the second side cover 21' spaced from the second light-emitting element 20' by a second light-transmitting layer 24' partly covers the peripheral side surface 20'c-20'f of the second light-emitting element 20'. The second side cover 21' covers a quarter or more area of the peripheral side surface 20'c-20'f of the second light-emitting element 20'. For more details, the second emitter 2' of the lighting device 200 includes the second light-transmitting layer 24' that includes a phosphor 4 that can be excited by light from the second light-emitting element 20'. The second light-transmitting layer 24' is arranged on the substrate 30' to seal the second light-emitting element 20'. In this embodiment, the second side cover 21' that partly covers the peripheral side surface 20'c-20'f of the second light-emitting element 20' is disposed in contact with a part of peripheral side surface 24'c-24'f of the second light-transmitting layer 24' and partly covers the peripheral side surface 24'c-24'f of the second light-transmitting layer 24'. The second side cover 21' is arranged to cover three sides of the peripheral side surface 24'c-24'f with an uncovered side portion 24'c that is uncovered by the second side cover 21'. The uncovered side portion 20'c of the second light-emitting element 20' is arranged to face the uncovered side portion 24'c of the second light-transmitting layer 24'. The second light-transmitting layer 24' further includes an upper surface 24'a that is located above the light-emitting surface 20ga of the second light-emitting element 20'.

Side cover including the first side cover 11' and the second side cover 21' is configured to shield and/or reflect light. The side cover may be made of white-colored resin. For example, the side cover may be made of silicone resin including titanium oxide ($TiO_2$) particle. The side cover may be opaque.

Figure 8:
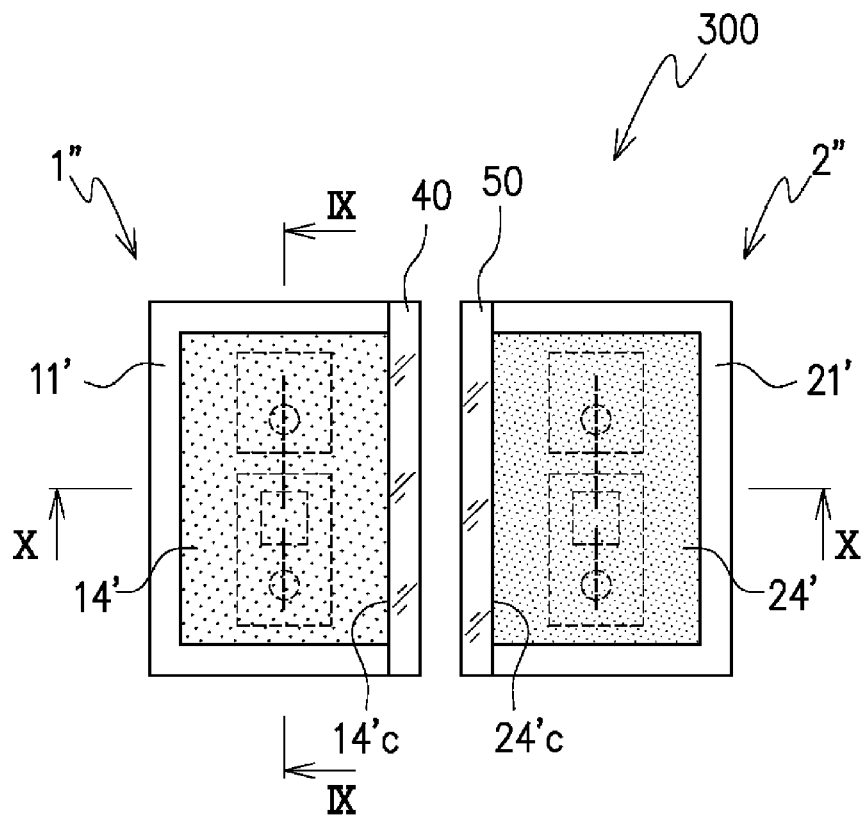
FIG. 8 is a top plan view of a lighting device according to a fourth embodiment of the present invention.
Figure 9:
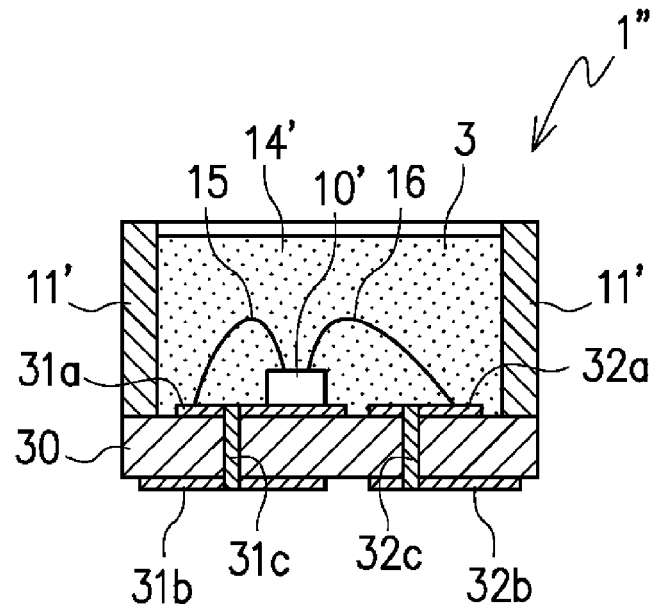
FIG. 9 is a cross-sectional view of a first light emitter of the lighting device taken along a line IX-IX shown in FIG. 8.
Figure 10:
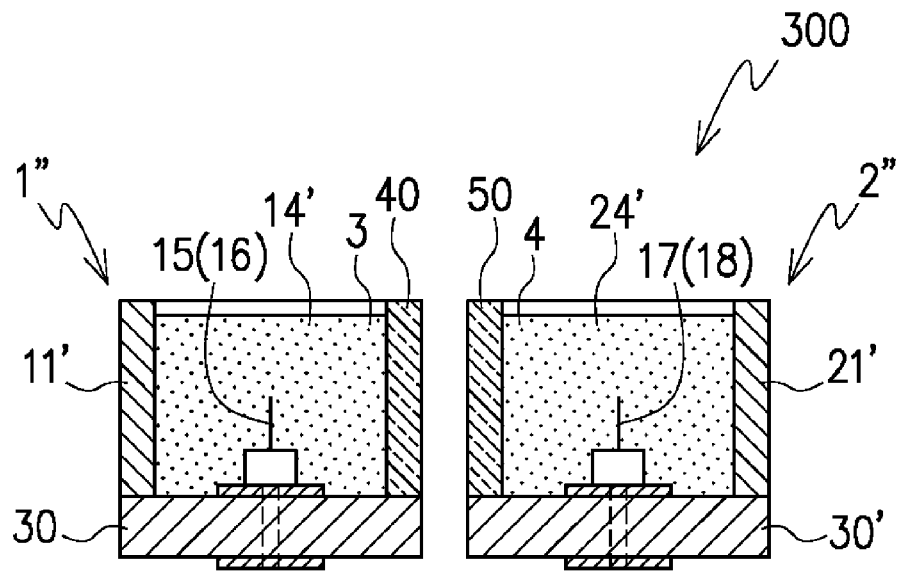
FIG. 10 is a cross-sectional view of the lighting device taken along a line X-X shown in FIG. 8.

FIG. 8 shows a top plan view of a lighting device according to a fourth embodiment of the present invention. FIG. 9 shows a cross-sectional view of a first light emitter of the lighting device taken along a line IX-IX shown in FIG. 8, and FIG. 10 shows a cross-sectional view of the lighting device taken along a line X-X shown in FIG. 8.

Different from the third embodiment, the first light emitter 1" of the lighting device 300 includes a first light diffusion layer 40 and the second light emitter 2" of the lighting device 300 includes a second light diffusion layer 50. The first light diffusion layer 40 is arranged on the uncovered side portion 14'c of the first light-transmitting layer 14'. The second light diffusion layer 50 is arranged on the uncovered side portion 24'c of the second light-transmitting layer 24'. The diffusion layer that includes the first light diffusion layer 40 and the second light diffusion layer 50 is made of light-transmitting resin. The diffusion layer includes a reflective particle. The reflective particle may be made of silicon dioxide ($SiO_2$). Accordingly, light emitted through the light diffusion layer at the uncovered side portion uncovered by the side cover can be diffused efficiently, and thus, light with emission spectrum range different from each other of light emitters can be mixed efficiently.

Also, the lighting device 300 may include an upper diffusion cover that is disposed above the light emitters 1", 2" that are disposed to face each other at uncovered side portions 14'c, 24'c that are uncovered by the first side cover 11' and the second side cover 21' but covered by the first diffusion layer 40 and the second diffusion layer 50. Also, it is possible to arrange three or more light emitters in the lighting device 300. If an upper diffusion cover that is positioned above the light emitters and that covers the light emitters from above is provided, light-mixing effect of light with emission spectrum range different from each other of light emitters can be more enhanced.

Except the configuration and arrangement of the light diffusion layer and/or the upper diffusion cover mentioned above, other configuration such as electrical connection between a light emitter and a substrate, light-transmitting layer including a phosphor and so on can be referred to the description in the third embodiment of the lighting device according to the present invention.

Figure 11:
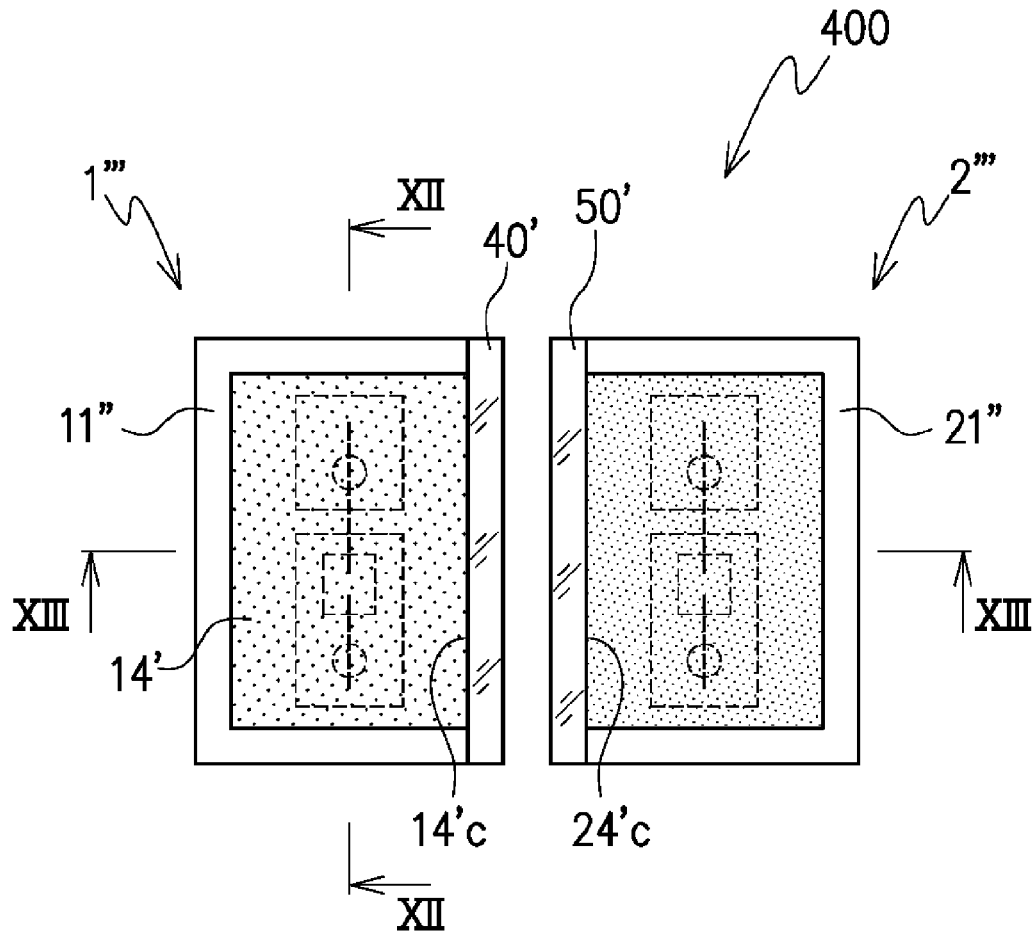
FIG. 11 is a top plan view of the lighting device according to a fifth embodiment of the present invention.
Figure 12:
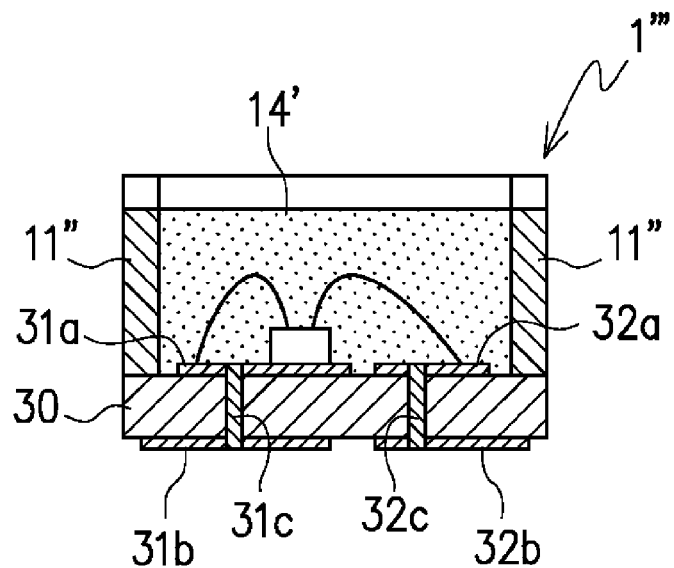
FIG. 12 is a cross-sectional view of the lighting device taken along a line XII-XII shown in FIG. 11.
Figure 13:
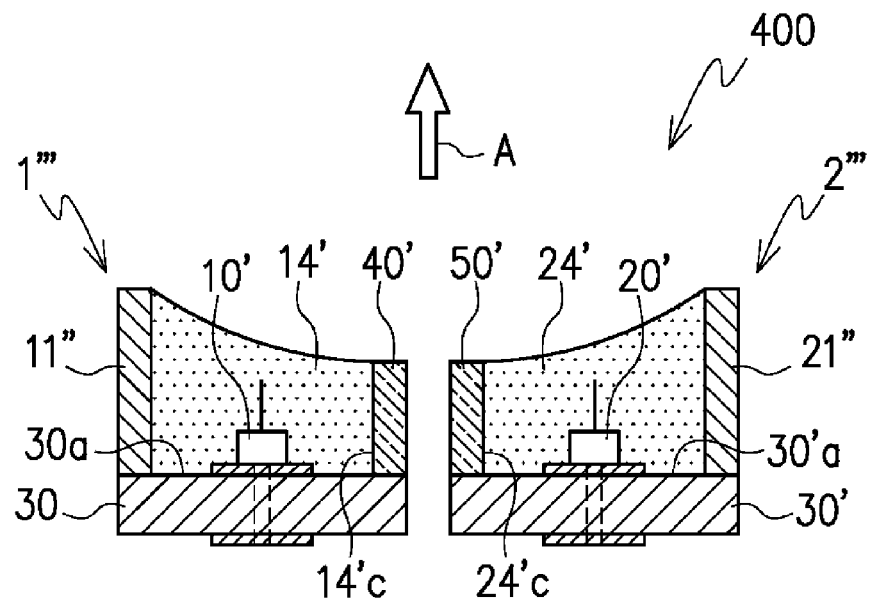
FIG. 13 is a cross-sectional view of a lighting device taken along a line XIII-XIII shown in FIG. 11.

FIG. 11 is a top plan view of the lighting device according to a fifth embodiment of the present invention. FIG. 12 is a cross-sectional view of the lighting device taken along a line XII-XII shown in FIG. 11. Also, FIG. 13 is a cross-sectional view of the lighting device taken along a line XIII-XIII shown in FIG. 11.

In the fifth embodiment, similarly to the fourth embodiment, the first light emitter 1' of the lighting device 400 may include a first light-transmitting cover 40' and the second light emitter 2'" of the lighting device 400 may include a second light-transmitting cover 50'. The first light-transmitting cover 40' is arranged on the uncovered side portion 14'c that is uncovered by the first side cover 11". As shown in FIG. 13, the first side cover 11" at a position opposite to the uncovered side portion 14'c that is uncovered by the first side cover 11" may be greater in height from an upper surface 30a of the substrate 30 than the first light-transmitting layer 14' from the upper surface 30a of the substrate 30 at a position adjacent to the uncovered side portion 14'c that is uncovered by the first side cover 11".

In this embodiment, the second light-transmitting cover 50' is arranged on the uncovered side portion 24'c that is uncovered by the second side cover 21". The second light-transmitting cover 50' at a position opposite to the uncovered side portion 24'c that is uncovered by the second side cover 21" may be greater in height from an upper surface 30'a of the substrate 30' than the second light-transmitting layer 24' from the upper surface 30'a of the substrate 30' at a position adjacent to the uncovered side portion 24'c that is uncovered by the second side cover 21".

Accordingly, light emitted from the first light emitter 1" and the second light emitter 2" toward the first side cover 11" and the second side cover 21" can be reflected inwardly in a direction inside the arrangements of the light emitters and/or shielded by the first side cover 11" and the second side cover 21". Therefore, narrower light distribution in an upward direction (shown as an arrow A in FIG. 13) compared to a lighting device according to the first to the fourth embodiments of the present invention can be expected.

Furthermore, it is possible to differentiate heights of the first side cover 11" and the second side cover 21" to change proportion of light to be mixed. For example, if a first light emitter 1" can emit light with emission spectrum range that is more required than light with emission spectrum range of a second light emitter 2", the first side cover 11" of the first light emitter 1" can be set higher than second side cover 21" of the second light emitter 2". Accordingly, light from the first light emitter 1" can be more directed by the first side cover 11" toward upward than light from the second light emitter 2" toward upward by the second side cover 21" that is lower than the first side cover 11'. The first side cover 11" covers a quarter or more area of the peripheral side surface of the first light-emitting element 10'. The second side cover 21" covers a quarter or more area of the peripheral side surface of the second light-emitting element 20'. The first side cover 11" and the second side cover 21" may be made of white resin. For example, the first side cover 11" and the second side cover 21" may be made of silicone resin including titanium oxide (TiO$_2$) particle. The first side cover 11" and the second side cover 21" may be opaque.

Figure 14:
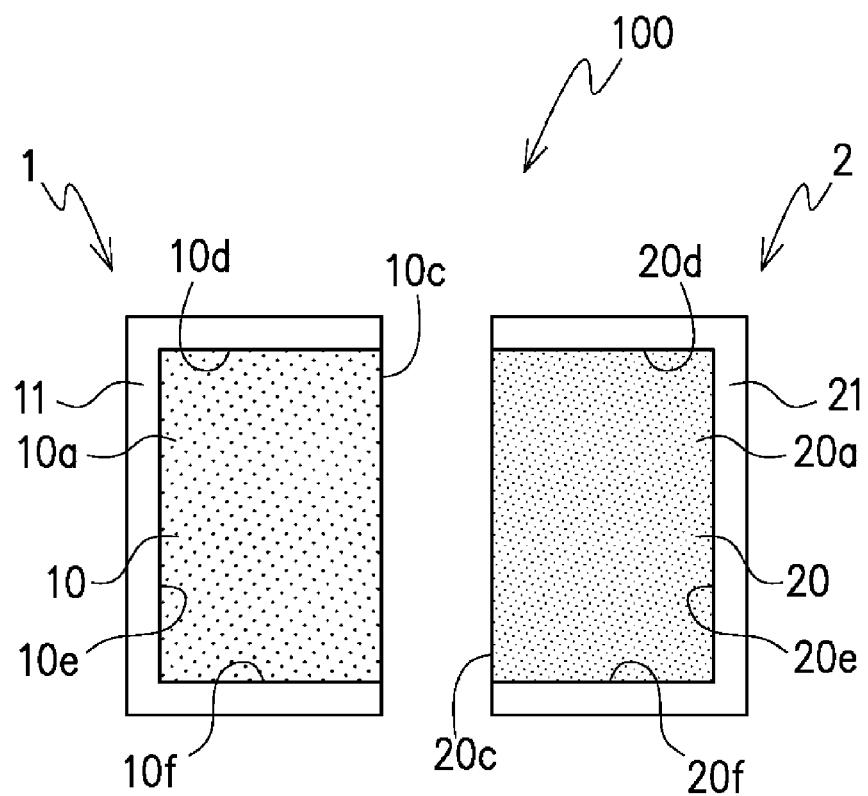
FIG. 14 shows an arrangement of two light emitters.
Figure 15:
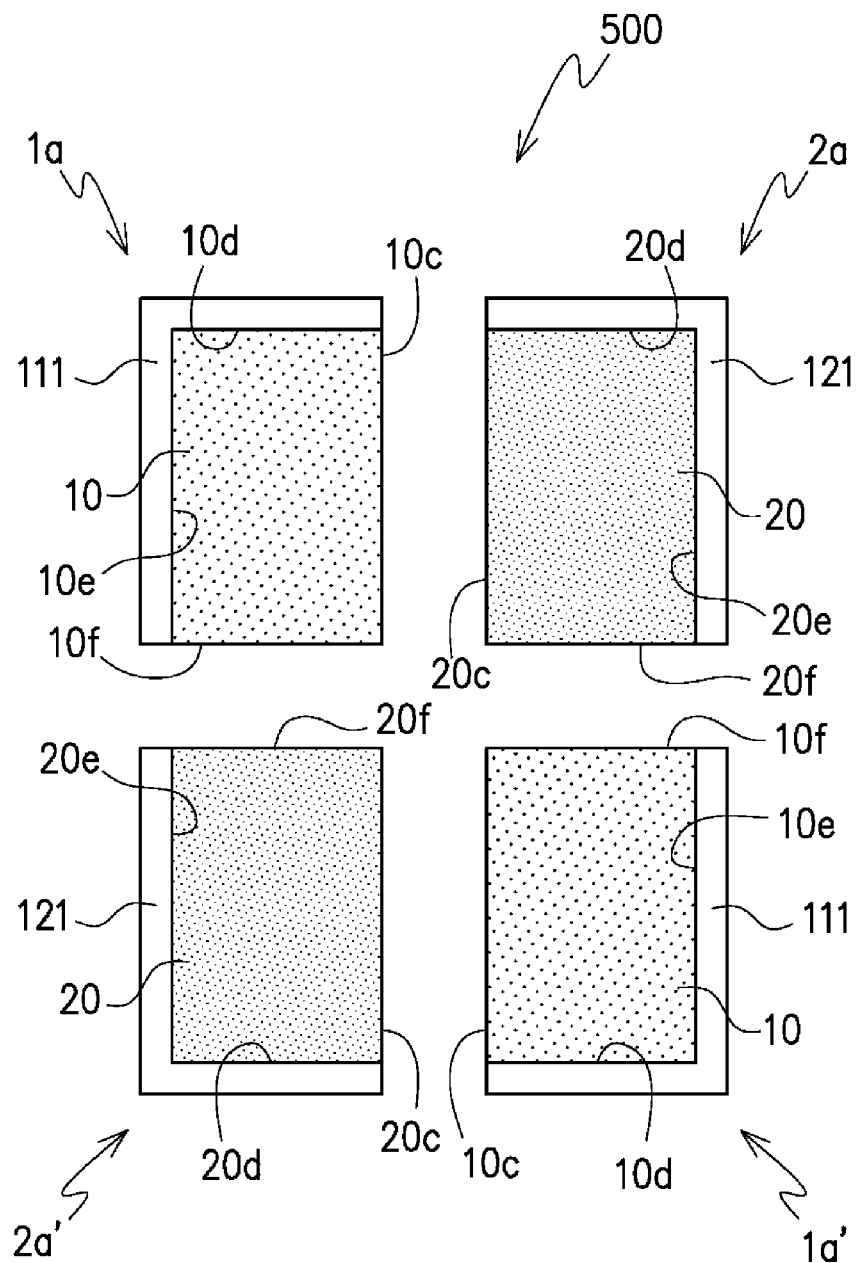
FIG. 15 shows an arrangement of four light emitters as a sixth embodiment of a lighting device according to the present invention.
Figure 16:
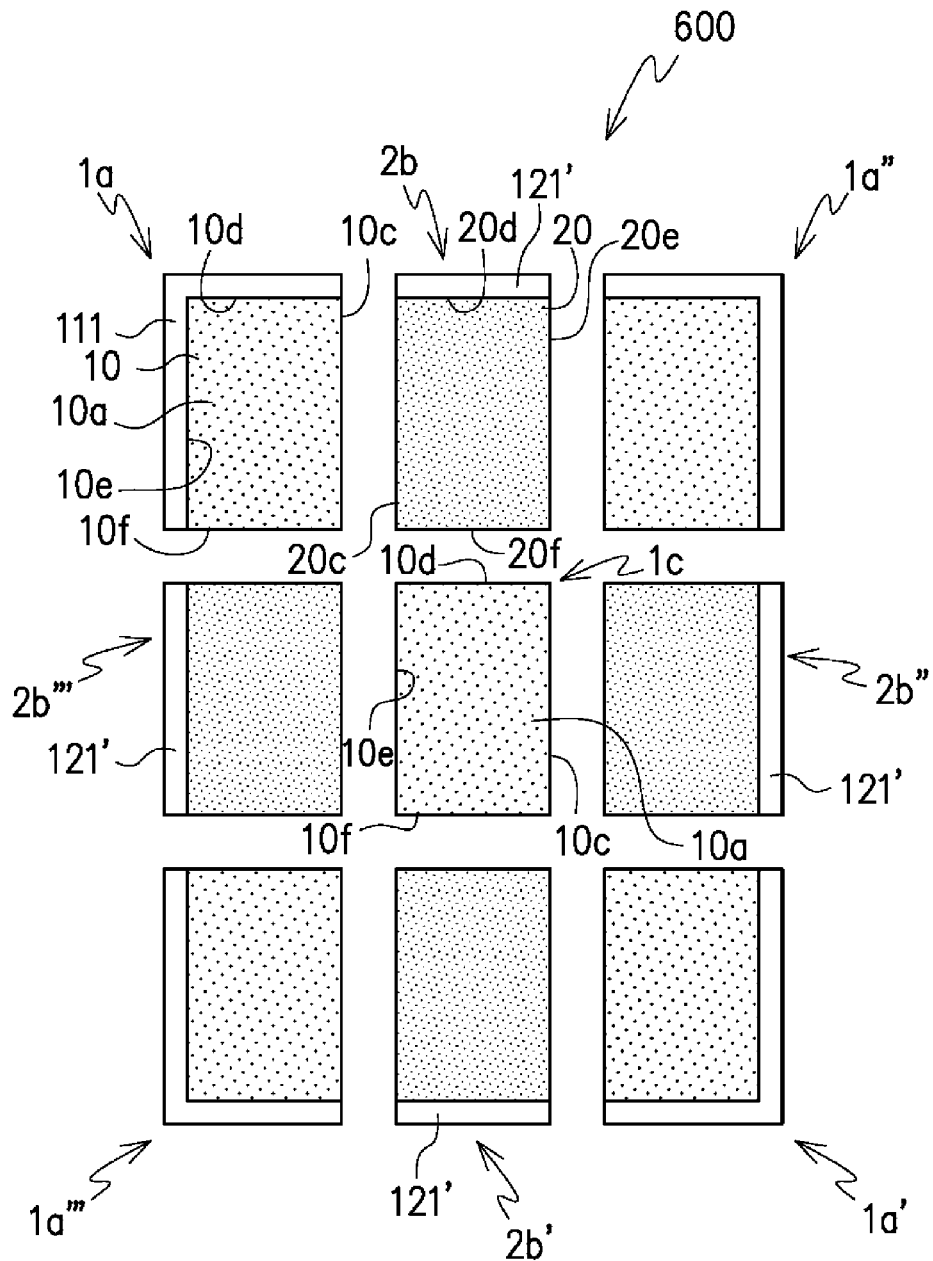
FIG. 16 shows an arrangement of nine light emitters as a seventh embodiment of a lighting device according to the present invention.

FIG. 14, FIG. 15 and FIG. 16 show arrangement embodiments of light emitters.

FIG. 14 shows an arrangement embodiment of two light emitters. The first side cover 11 covers three sides (a first side 10*d*, a second side 10*e*, and a third side 100 of the first light-emitting element 10. The second side cover 21 covers three sides (a first side 20*d*, a second side 20*e*, and a third side 200 of the second light-emitting element 20. A fourth side 10*c* uncovered by the first side cover 11 of the first light emitter 1 faces a fourth side 20*c* that is uncovered by the second side cover 21 of the second light emitter 2. As previously disclosed in the first embodiment according to the present invention, the lighting device 100 includes the first side cover 11 that is arranged in contact with three sides of a peripheral side surface of the first light-emitting element 10. The second side cover 21 is arranged in contact with three sides of a peripheral side surface of the second light-emitting element 20.

FIG. 15 shows an arrangement embodiment of four light emitters as a sixth embodiment of lighting device according to the present invention. A lighting device 500 includes a first light emitter 1*a* that includes a first light-emitting element with a p-n junction and a first side cover 111 partly covering a peripheral side surface of the first light-emitting element 10, and a second light emitter 2*a* that includes a second light-emitting element 20 with a p-n junction and a second side cover 121 partly covering a peripheral side surface of the second light-emitting element 20. The first light emitter 1*a* and the second light emitter 2*a* are configured to emit light with emission spectrum range different from each other and adjacently positioned to face each other at uncovered side portions 10*c*, 20*c* that are uncovered by the first side cover 111 and the second side cover 121. The lighting device 500 in this embodiment further includes a third light emitter 1*a*' that includes a third light-emitting element 10 with a p-n junction and a third side cover 111 partly covering a peripheral side surface of the third light-emitting element 10, and a fourth light emitter 2*a*' that includes a fourth light-emitting element 20 with a p-n junction and a fourth side cover 121 partly covering a peripheral side surface of the fourth light-emitting element 20. The first side cover 111 of the first light emitter 1*a* covers a quarter or more area of the peripheral side surface of the first light-emitting element 10. The second side cover 121 of the second light emitter 2*a* covers a quarter or more area of the peripheral side surface of the second light-emitting element 20. The third side cover 111 of the third light emitter 1*a*' covers a quarter or more area of the peripheral side surface of the third light-emitting element 10. The fourth side cover 121 of the fourth light emitter 2*a*' covers a quarter or more area of the peripheral side surface of the fourth light emitting element 20.

For more details, the first side cover 111 covers two sides 10*e*, 10*d* of the first light-emitting element 10 of the first light emitter 1*a*, the second side cover 121 covers two sides 20*e*, 20*d* of the second light-emitting element 20 of the second light emitter 2*a*, the third side cover 111 covers two sides 10*e*, 10*d* of the third light-emitting element 10 of the third light emitter 1*a*', and the fourth side cover 121 covers two sides 20*e*, 20*d* of the fourth light-emitting element 20.

The first light emitter 1*a*, the second light emitter 2*a*, the third light emitter 1*a*', and the fourth light emitter 2*a*' are arranged to face each other at uncovered side portions 10*c*, 10*f*, 20*c*, 20*f*.

The first light emitter 1*a* and the third light emitter 1*a*' that are arranged diagonally to face each other may be configured to emit light within a first emission spectrum range of light, for example, blue light. The second light emitter 2*a* and the fourth light emitter 2*a*' that are arranged diagonally to face each other may be configured to emit light within a second emission spectrum range of light, for example, red light.

Accordingly, light-mixing effect of light with emission spectrum range different from each other can be achieved.

Also, the first light emitter, the second light emitter, the third light emitter, and the fourth light emitter can be configured to emit light with emission spectrum range different from each other. Furthermore, as explained in the fourth embodiment, it is possible to arrange a light diffusion layer on an uncovered side portion of light-emitting element to mix light with emission spectrum range different from each other.

Also, it is possible to arrange light emitters in an area that can be an elongated shape, a square shape, a rectangular shape, or a circular shape. The light-emitters may be arranged in a line, in lines that are parallel with each other, in lines including a non-linear line, in a matrix, in a zigzag pattern, and/or a combination thereof. It is possible that a lighting device include one or more light emitter(s) without a side cover(s). A lighting device includes light emitters arranged in an area, and includes a first light emitter, a second light emitter, and a third light emitter. The first light emitter of the light emitters includes a first light-emitting element and a first side cover partly covering a peripheral side surface of the first light-emitting element, and the first side cover of the first light emitter may cover a quarter or more area of the peripheral side of the first light-emitting element. The second light emitter of the light emitters includes a second light-emitting element and a second side cover partly covering a peripheral side surface of the second light-emitting element, and the second side cover of the second light emitter covering a quarter or more area of the peripheral side of the second light emitting element. The third light emitter of the light emitters is positioned inside of positions of the first light emitter and the second light emitter in the area, and the third light emitter is configured to emit light radially from the peripheral side surface. Accordingly, the third light emitter is configured to emit light from all sides of the peripheral side surface and an upper surface. Light from the first light emitter, light from the second light emitter, and light from the third light emitter are configured to be directed upward by the side cover including the first side cover and the second side cover above the area in that the light emitters are arranged.

As an embodiment, the lighting device may include at least a third light emitter that is configured to emit amber white light including red color component. The at least a third light emitter may be positioned at a central section of the area. Furthermore, the lighting device may include one or more drive circuits that are configured to activate the at least a third light emitter separately from the first light emitter and the second light emitter. By altering amount of current that flows in the third light emitter, by altering amount of current that flows in other light emitters, and/or by a combination of alterations, the lighting device may achieve a dimmer and/or color control of light from the lighting device. Furthermore, it is possible to arrange a fourth or more light emitters in the area.

FIG. 16 shows an arrangement of nine light emitters as a seventh embodiment of a lighting device according to the present invention. A lighting device 600 includes a first light emitter 1a that includes a first light-emitting element 10 with a p-n junction and a first side cover 111 partly covering a peripheral side surface of the first light-emitting element 10, and a second light emitter 2b that includes a second light-emitting element 20 with a p-n junction and a second side cover 121' partly covering a peripheral side surface of the second light-emitting element 20. The first light emitter 1a and the second light emitter 2b may be configured to emit light with emission spectrum range different from each other and adjacently positioned to face each other at uncovered side portions 10c, 20c that are uncovered by the first side cover 111 and the second side cover 121'. The first side cover 111 covers two sides 10e, 10d of the peripheral side surface 10c-10f of the first light-emitting element 10.

The second side cover 121' of the second light emitter 2b in this embodiment covers one side 20d of the peripheral side surface 20c-20f of the second light-emitting element 20. The lighting device 600 includes four first light emitters 1a, 1a', 1a" and 1a'" that are arranged four corners of an area. Also, the lighting device 600 includes four second light emitters 2b, 2b', 2b" and 2b'" each arranged between two of the first light emitters 1a, 1a', 1a" and 1a'". Furthermore, the lighting device 600 includes a third light emitter 1c that is positioned inside of positions of the first light emitters 1a, 1a', 1a" and 1a'" and the second light emitters 2b, 2b', 2b" and 2b'" in the area. The third light emitter 1c without side cover is configured to emit light radially from the peripheral side surface 10c, 10d, 10e, 10f as well as an upper surface 10a of the third light emitter 1c.

The first side covers 111 and the second side covers 121' of the first light emitters 1a, 1a', 1a" and 1a'" and the second light emitters 2b, 2b', 2b" and 2b'" are positioned to surround the area of the lighting device 600. Light from the first light emitter, light from the second light emitter and light from the third light emitter can be directed by the side covers of light emitters toward upward above the area in that the light emitters are arranged.

Accordingly, light emitted from the first light emitters 1a, 1a', 1a", 1a'" with the first side covers 111 and the second light emitters 2b, 2b', 2b", 2b'" with the second side covers 121' and the third light emitter without side cover can be mixed efficiently as upward light.

FIG. 16 shows the lighting device 600 from above. The third light emitter 1c positioned at the center of the area may emit light with emission spectrum range that is same and/or similar to the first light emitters 1a, 1a', 1a", 1a'". The word "same" here includes a case in that the first light emitter and the third light emitter are configured to emit light within the same emission spectrum range. The word "similar" here includes a case in that the first light emitter and the third light emitter are configured to emit light within the same emission spectrum range and also can emit light with emission spectrum range different from each other of the first light emitter and the third light emitter.

Also, it is possible that the third light emitter 1c positioned at the center of the area may emit light with emission spectrum range that is same and/or similar to the second light emitters 2b, 2b', 2b", and 2b'". Furthermore, the third light emitter 1c that can emit light with emission spectrum range different from the emission spectrum range of the first light emitter and also different from the emission spectrum range of the second light emitter.

Figure 17:
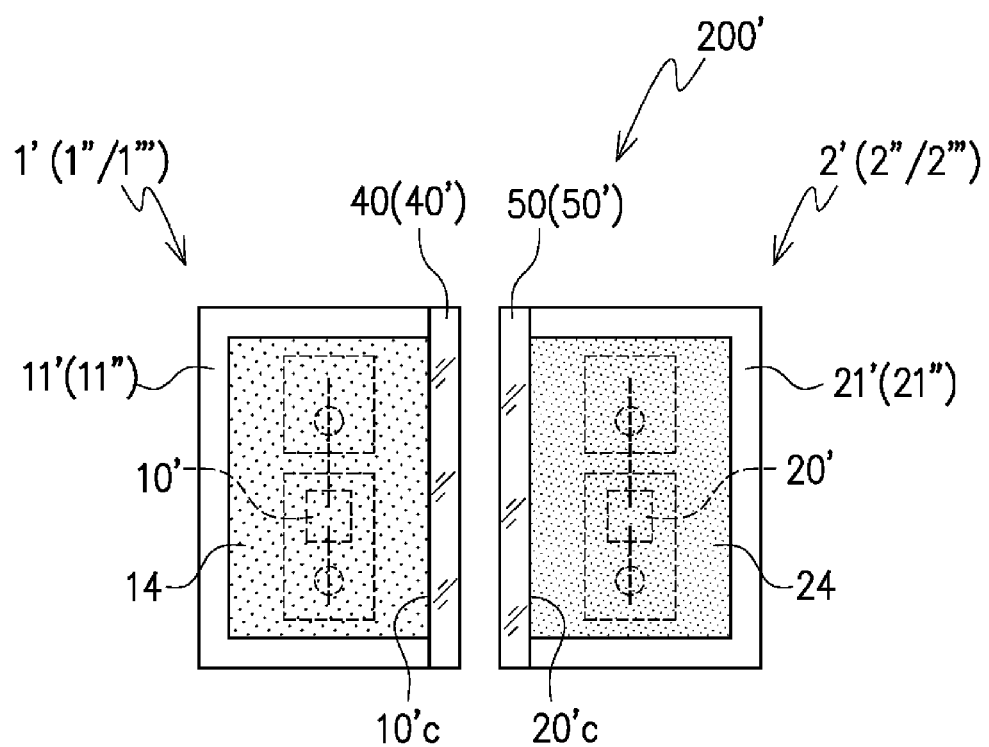
FIG. 17 shows an arrangement of two light emitters.

FIG. 17 shows an arrangement embodiment of two light emitters, similar to the lighting device 200 shown in FIG. 5.

The lighting device 200' shown in FIG. 17 includes a first light emitter that can have one or more configurations explained in embodiments with reference to FIGS. 5-13, and thus, reference number 1', 1", or 1'" is attached here. The first side cover 11' or 11" that partly covers the peripheral side surface 10'c-10'f of the first light-emitting element 10' is disposed in contact with a part of peripheral side surface 10'c-10'f of the first light-transmitting layer 14 and partly covers the peripheral side surface of the first light-transmitting layer 14.

Furthermore, the lighting device 200' shown in FIG. 17 includes a second light emitter 2', 2", or 2'" that includes a substrate 30' (not shown in FIG. 17 but shown in FIG. 7) on that the second light-emitting element is electrically mounted and a second light-transmitting layer 24' arranged on the substrate 30' to seal the second light-emitting element. The second light emitter can have one or more configurations explained in embodiments with reference to FIGS. 5-13, and thus, reference number 2', 2", or 2'" is attached here.

The second side cover 21' or 21" that partly covers the peripheral side surface 20c-20f of the second light-emitting element 20 is disposed in contact with a part of peripheral side surface of the second light-transmitting layer 24 and partly covers the peripheral side surface of the second light-transmitting layer 24. The lighting device 200' shown in FIG. 17 further includes a first light diffusion layer 40 or a first light-transmitting cover 40' arranged in contact with the uncovered side portion 10c uncovered by the first side cover 11' or 11". Also, the lighting device 200' may include a second light diffusion layer 50 or a second light-transmitting cover 50' arranged in contact with the uncovered side portion 20c uncovered by the second side cover 21' or 21".

As previously disposed in the fifth embodiment shown in FIGS. 11-13, the first side cover 11" may be higher than the first light-transmitting cover 40' in height from the upper surface of the substrate 30. Also, the second side cover 21" may be higher than the second light-transmitting cover 50' in height from the upper surface of the substrate 30'.

Figure 18:
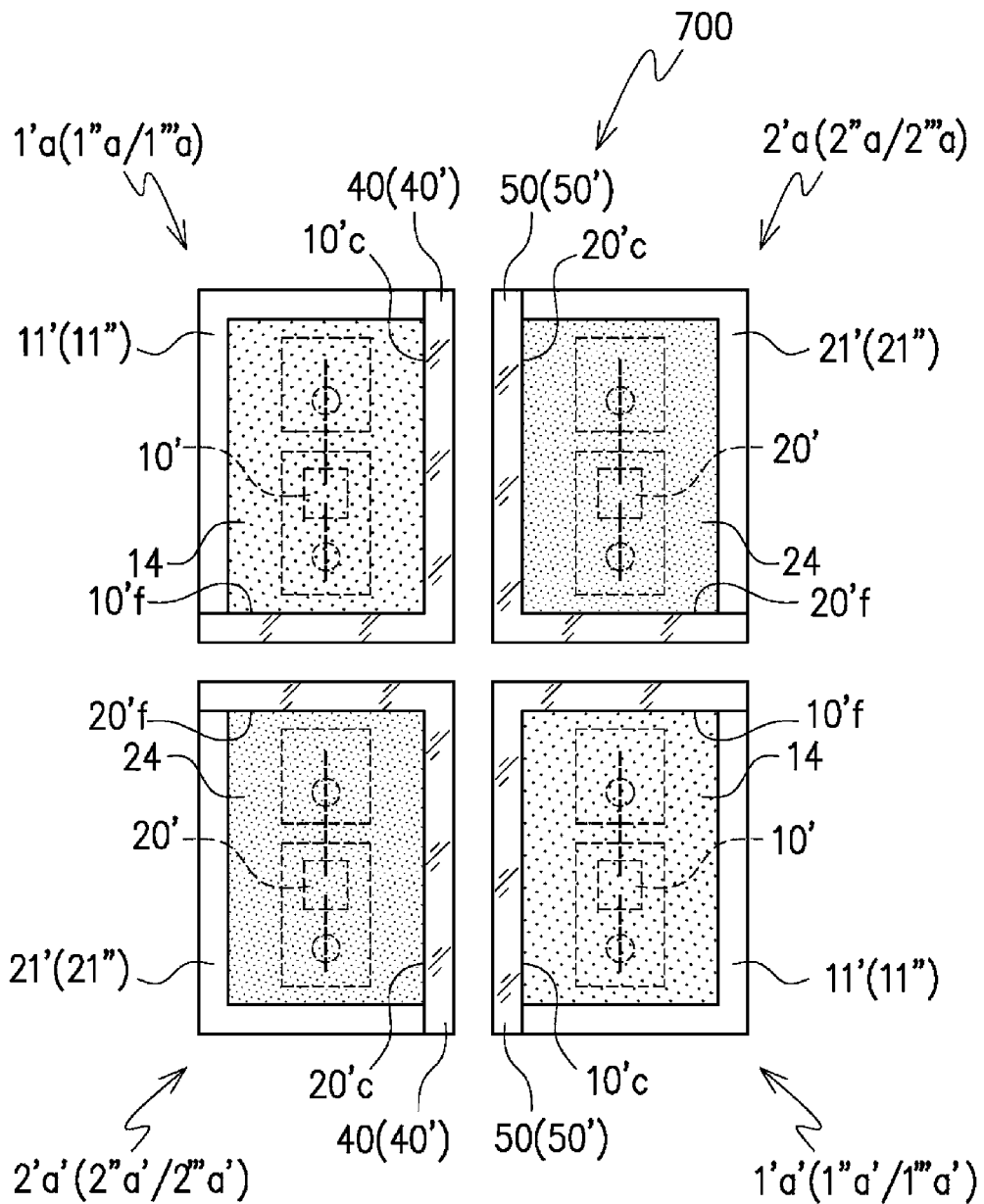
FIG. 18 shows an arrangement of four light emitters as an eighth embodiment of a lighting device according to the present invention.
Figure 19:
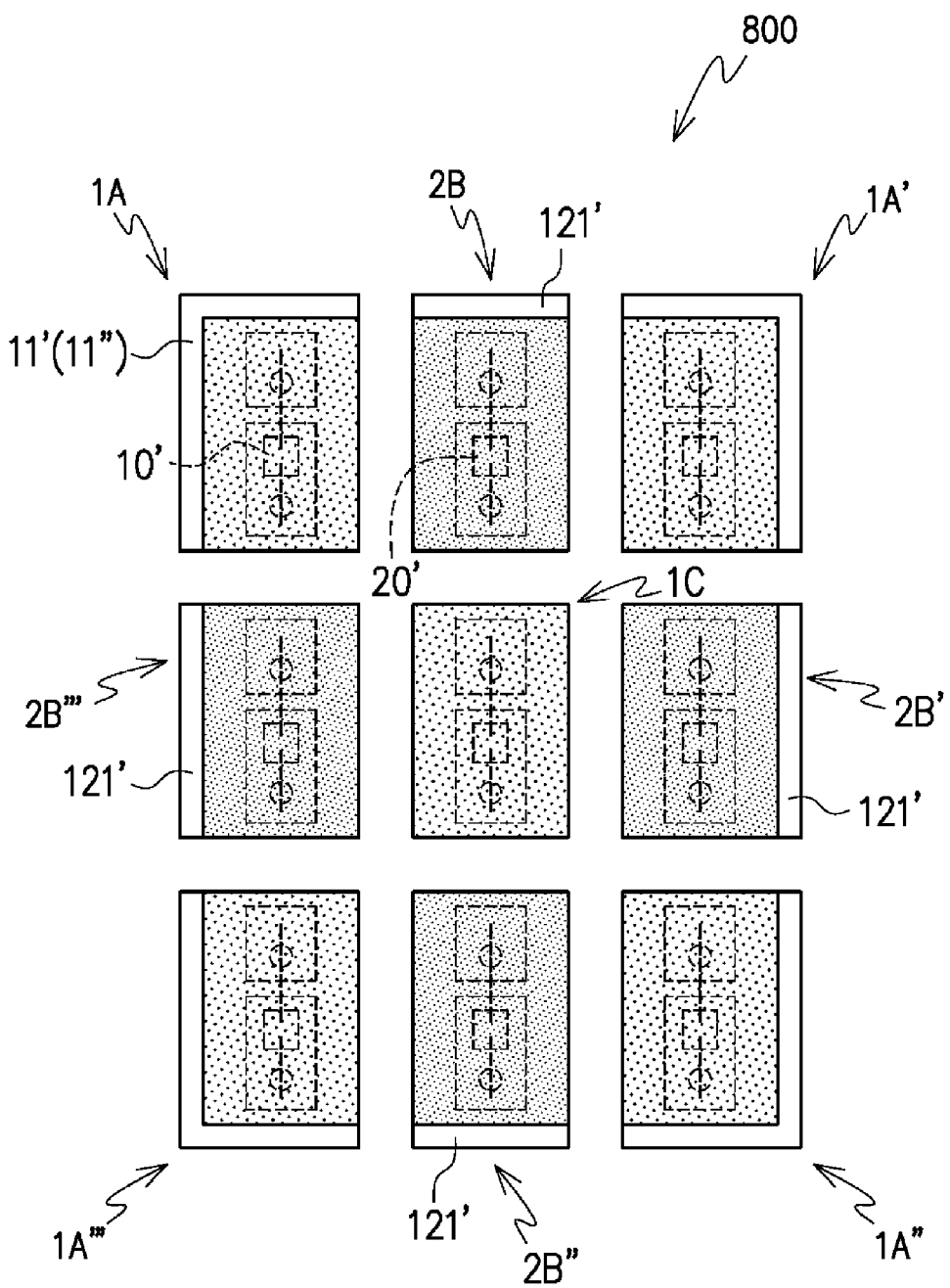
FIG. 19 shows an arrangement of nine light emitters as a ninth embodiment of a lighting device according to the present invention.

FIG. 18 shows an arrangement of four light emitters as an eighth embodiment of a lighting device, and FIG. 19 shows an arrangement of nine light emitters as a ninth embodiment of a lighting device according to the present invention.

The arrangement of FIG. 17 is similar to the arrangement of FIG. 14, the arrangement of FIG. 18 is similar to the arrangement of FIG. 15, and the arrangement of FIG. 19 is similar to the arrangement of FIG. 16. The main difference between arrangements of FIGS. 14-16 and arrangements of FIGS. 17-19 is whether a side cover is directly disposed on a light-emitting element (as shown in FIGS. 14-16) or not (as shown in FIGS. 17-19).

FIG. 18 shows an arrangement embodiment of four light emitters as an eighth embodiment of lighting device according to the present invention. A lighting device 700 includes a first light emitter 1'a, 1"a, or 1'''a that includes a first light-emitting element 10' with a p-n junction and a first side cover 11' or 11" partly covering a peripheral side surface of the first light-emitting element 10', and a second light emitter 2'a, 2"a or 2'''a that includes a second light-emitting element 20' with a p-n junction and a second side cover 21' or 21" partly covering a peripheral side surface of the second light-emitting element 20'. The first light emitter 1'a, 1"a, or 1'''a and the second light emitter 2'a, 2"a, or 2'''a are configured to emit light with emission spectrum range different from each other and adjacently positioned to face each other at uncovered side portions 10'c, 20'c that are uncovered by the first side cover 11' or 11" and the second side cover 21' or 21". In this embodiment, as previously mentioned, a first light diffusion layer 40 or a first light-transmitting cover 40' may be arranged at the uncovered side portion 10'c and a light diffusion layer 50 or a second light-transmitting cover 50' may be arranged at the uncovered side portion 20'c.

The lighting device 700 in this embodiment further includes a third light emitter 1'a', 1"a', or 1'''a' that includes a third light-emitting element 10' with a p-n junction and a third side cover 11' or 11" partly covering a peripheral side surface of the third light-emitting element 10', and a fourth light emitter 2'a', 2"a', or 2'''a' that includes a fourth light-emitting element 20' with a p-n junction and a fourth side cover 21' or 21" partly covering a peripheral side surface of the fourth light-emitting element 20'.

The first side cover 11' or 11" that partly covers the peripheral side surface 10'c-10'f of the first light-emitting element 10' is disposed in contact with a part of peripheral side surface 10'c-10'f of the first light-transmitting layer 14 and partly covers the peripheral side surface of the first light-transmitting layer 14.

The second side cover 21' or 21" that partly covers the peripheral side surface 20'c-20'f of the second light-emitting element 20' is disposed in contact with a part of peripheral side surface of the second light-transmitting layer 24 and partly covers the peripheral side surface of the second light-transmitting layer 24.

The first light emitter 1'a, 1"a, or 1'''a, the second light emitter 2'a, 2"a, or 2'''a, the third light emitter 1'a', 1"a', or 1'''a', and the fourth light emitter 2'a', 2"a', or 2'''a' are arranged to face each other at uncovered side portions 10'c, 10'f, 20'c, 20'f.

The first light emitter and the third light emitter may be configured to emit light with emission spectrum range similar to each other. The first light emitter 1'a, 1"a, or 1'''a and the third light emitter 1'a', 1"a', or 1'''a' that are arranged diagonally to face each other may be configured to emit light within a first spectrum range, for example, blue light. The word "similar" here includes a case in that the first light emitter and the third light emitter are configured to emit blue light within the same emission spectrum range and also can emit light with emission spectrum range different from each other, for example: the first light emitter includes a phosphor that can be excited to emit yellow light and the third light emitter includes a phosphor that can be excited to emit red light.

Also, the third light emitter and the fourth light emitter may be configured to emit light with emission spectrum range similar to each other.

The second light emitter 2'a, 2"a, or 2'''a and the fourth light emitter 2'a', 2"a', or 2'''a' that are arranged diagonally to face each other may be configured to emit light within a second spectrum of light, for example, green light. Furthermore, it is possible that the first light emitter may include a blue light-emitting element and a YAG phosphor, and the third light emitter may include a blue light-emitting element and a red phosphor, for example. Also, it is possible that the second light emitter may include a near ultraviolet light-emitting element and a green phosphor, and the fourth light emitter may include a near ultraviolet light-emitting element and a red phosphor, green phosphor, and blue phosphor.

Accordingly, light-mixing effect of light with emission spectrum different from each other can be achieved.

FIG. 19 shows an arrangement of nine light emitters similar to the seventh embodiment of a lighting device according to the present invention. Different from the seventh embodiment, in a lighting device 800, a light-emitting element of light emitter is arranged on a substrate and sealed by a light-transmitting layer including a phosphor on the substrate. A side cover is not directly disposed on a light-emitting element but directly disposed on the light-transmitting layer to cover a part of peripheral side surface of the light-emitting element. The lighting device 800 includes a first light emitter 1A that includes a first side cover 11' or 11" covering two sides of the first light-emitting element, a second light emitter 2B that includes a second side cover covering one side of the second light-emitting element 20, and a third light emitter 1C configured to emit light radially as well as to emit light upward. In this embodiment, there are four first light emitters 1A, 1A', 1A" and 1A''' arranged at four corners of a light emitting area of the lighting device 800. Also, there are four second light emitters 2B, 2B', 2B" and 2B''' each arranged between two of the first light emitters (between 1A and 1A', between 1A' and 1A", between 1A" and 1A''', and between 1A and 1A'''). The third light emitter 1C is positioned inside of positions the first light emitters and the second light emitters. Accordingly, the third light emitter 1C is positioned adjacent to a center of a light-emitting area of the lighting device 800, surrounded by the first light emitters 1A, 1A', 1A" and 1A''' and the second light emitters 2B, 2B', 2B" and 2B'''. The nine light emitters are configured to emit light from respective uncovered side portions that are uncovered by the side covers made of white resin and from respective upper surfaces. Accordingly, upward light from the light emitters can appear to be a mixed light.

Figure 20:
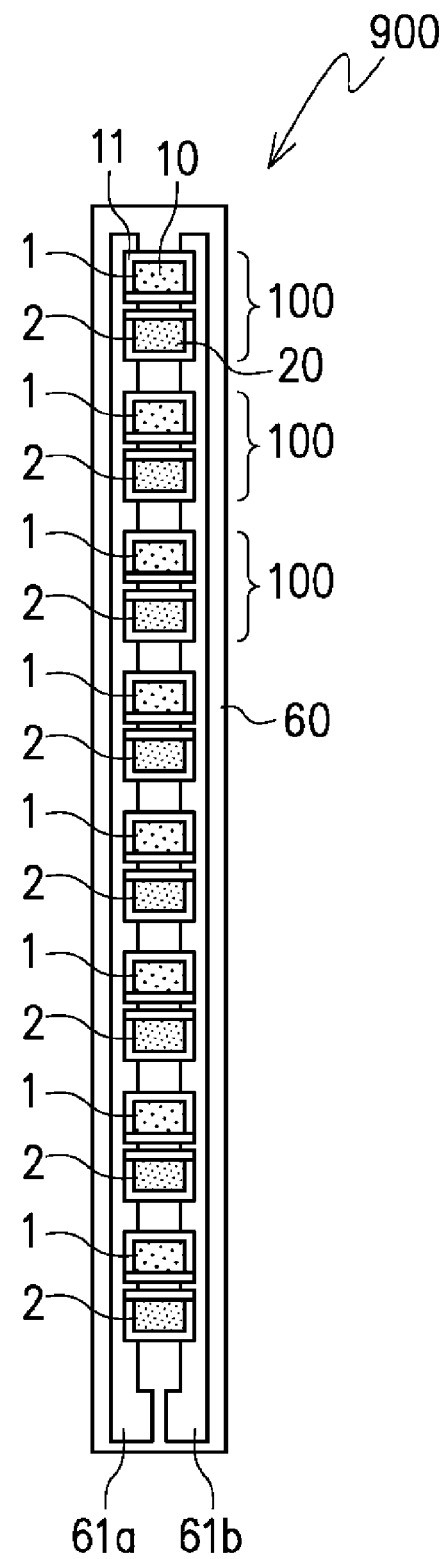
FIG. 20 is a top plan view of a lighting device according to a tenth embodiment of the present invention.

FIG. 20 shows a top plan view of lighting device according to a tenth embodiment of the present invention.

The lighting device 900 includes a first light emitter 1 including a first light-emitting element 10 with a p-n junction and a first side cover 11 partly covering a peripheral side surface of the first light emitting element 10, and a second light emitter 2 including a second light-emitting element 20 with a p-n junction and a second side cover 21 partly covering a peripheral side of the second light-emitting element 20 as a pair 100. The first light emitter 1 and the second light emitter 2 can be configured to emit spectrum of light different from each other and adjacently positioned to face each other at uncovered side portions that are uncovered by the first side cover 11 and the second side cover 21. The lighting device 900 includes pairs 100 of first light-emitter 1 and second light-emitter 2 that are electrically mounted on a circuit substrate 60 one after another of the pairs 100 in a line. The first light emitter 1 and the second light emitter 2 of each pair 100 face each other vertically or along the line. The circuit substrate 60 may be a flexible circuit substrate having an elongated shape. The circuit substrate 60 may includes a pair of terminal electrodes that are a first electrode 61*a* and a second electrode 61*b*. The first electrode 61*a* and the second electrode 61*b* may be arranged at one end of the circuit substrate 60. Also, it is possible to arrange the first electrode 61*a* at a first end of the circuit substrate 60 and the second electrode 61*b* at a second end of the circuit substrate 60. Light-emitting elements in the light emitters are electrically connected to the pair of terminal electrodes, and thus, electrical current can be supplied to the light emitters arranged in a line through the pair of terminal electrodes 61*a* and 61*b*. The lighting device 900 in this embodiment can be used as a light source of a lighting device that has a linear shape.

The lighting device 900 shown in FIG. 20 is explained above to include pairs 100 each including a first light emitter 1 and a second light emitter 2. The first light emitter 1 can be the first light emitter with the reference number 1', 1", or 1''' explained in previous embodiments with reference to FIGS. 5-13, and the second light emitter 2 can be the second light emitter with the reference number 2', 2", or 2''' explained in previous embodiments with reference to FIGS. 5-13.

Furthermore, as previously mentioned, a combination of light-emitters and a phosphor is not limited to embodiments explained herein.

Figure 21:
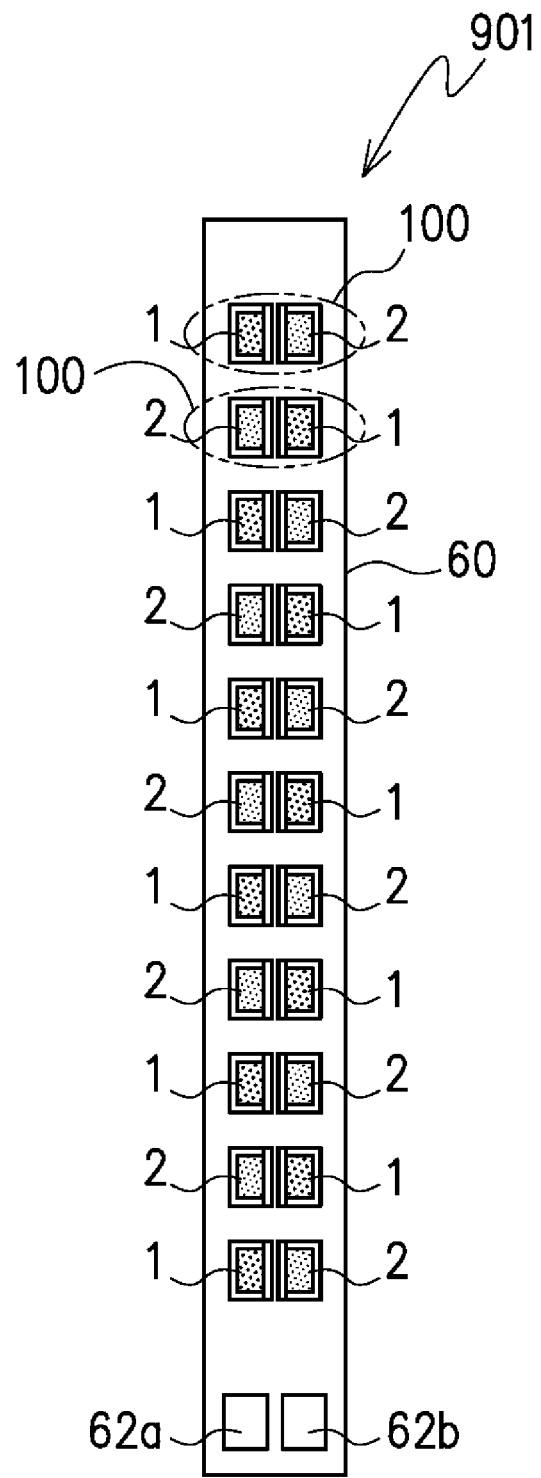
FIG. 21 is a top plan view of a lighting device according to an eleventh embodiment of the present invention.

As shown in FIG. 21, it is possible to provide a linear lighting device 901 to arrange pairs 100 of first light emitter 1 and second light emitter 2 one pair after another pair in a line. The first light emitter 1 and the second light emitter 2 of each pair in this embodiment face each other laterally or across the line. The first light emitters 1 and the second light emitters 2 are electrically connected to a pair of terminal electrodes 62*a* and 62*b*.

Furthermore, it is also possible to provide a linear lighting device to arrange groups each including four light emitters, groups each including six light emitters and/or groups each including more light emitters. Groups can be arranged one group after another group in a line.

The lighting device 901 shown in FIG. 21 is explained above to include pairs 100 each including a first light emitter 1 and a second light emitter 2. The first light emitter 1 can be the first light emitter with the reference number 1', 1", or 1''' explained in previous embodiments with reference to FIGS. 5-13, and the second light emitter 2 can be the second light emitter with the reference number 2', 2", or 2''' explained in previous embodiments with reference to FIGS. 5-13.

Figure 22:
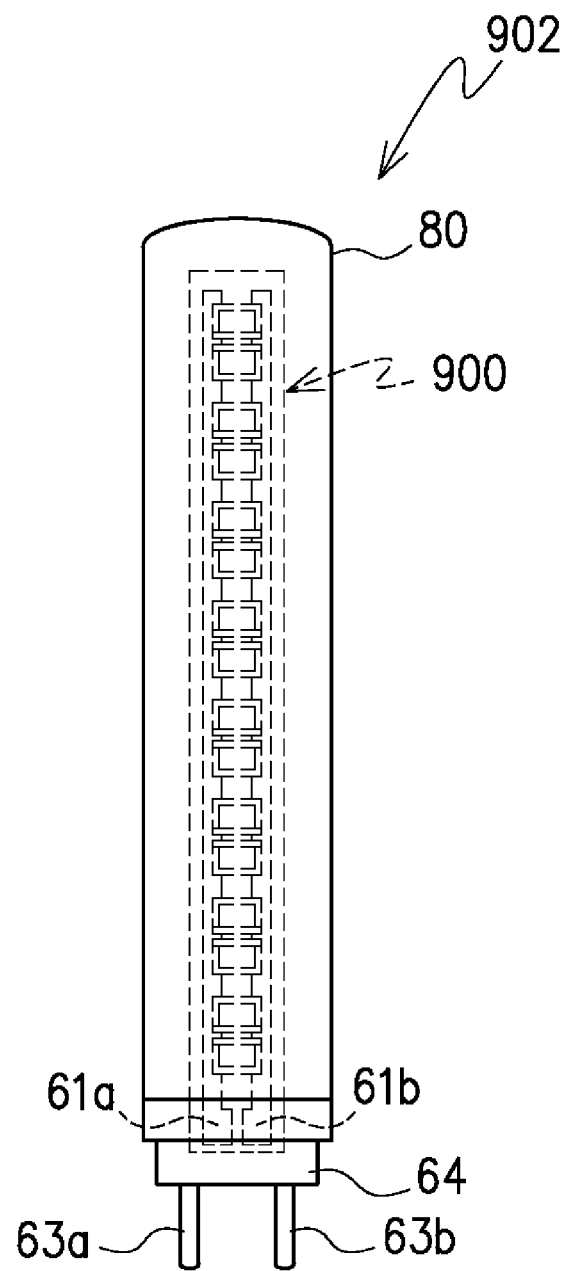
FIG. 22 is a front elevational view of a lighting device according to a twelfth embodiment of the present invention.

FIG. 22 shows a lighting device according to a twelfth embodiment of the present invention. The lighting device 902 includes pairs of first light emitter and second light emitter arranged in a line, for example the linear lighting device 900.

The lighting device 902 further includes a light transmitting cover 80 covering the light emitters and a holder 64 supporting the transmitting cover 80 and including a pair of terminals 63*a* and 63*b*. The light transmitting cover 80 may be made of glass and/or resin. Also, the pair of terminals 63*a* and 63*b* are electrically connected to the terminal electrodes 61*a* and 61*b* arranged on the circuit substrate 60. The lighting device 902 as a linear lighting device may includes one or more lighting devices 900 arranged with an angle inside the lighting device 902 to emit light in one or more directions. The light-emitting elements of light emitters are mounted on the circuit substrate 60 and electrically connected to the first electrode 61*a* and the second electrode 61*b* of the circuit substrate 60. Electrical current will be supplied to the first electrode 61*a* and the second electrode 61*b* arranged on the circuit substrate 60 through the terminals 63*a* and 63*b* from outside. The holder 64 may include a control circuit that can control supply of electrical current to the light-emitting elements.

Figure 23:
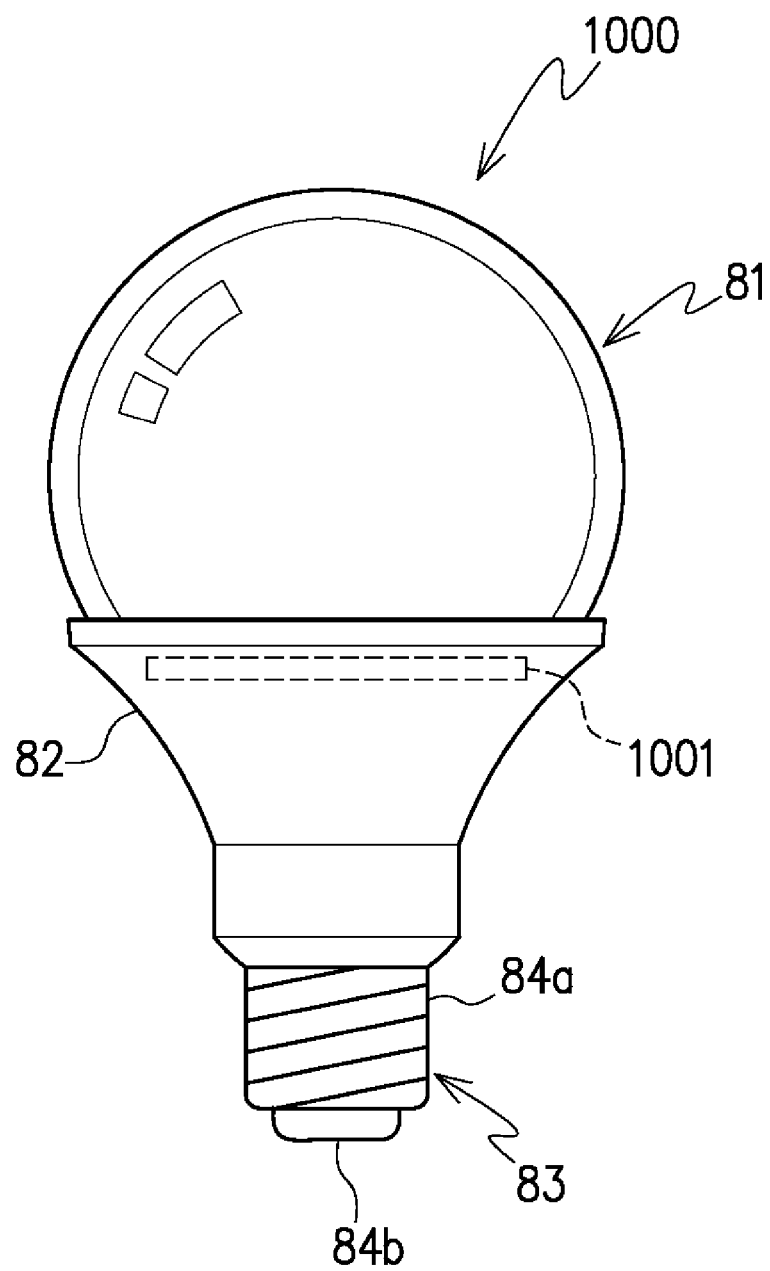
FIG. 23 is a front elevational view of a lighting device according to a thirteenth embodiment of the present invention.
Figure 24:
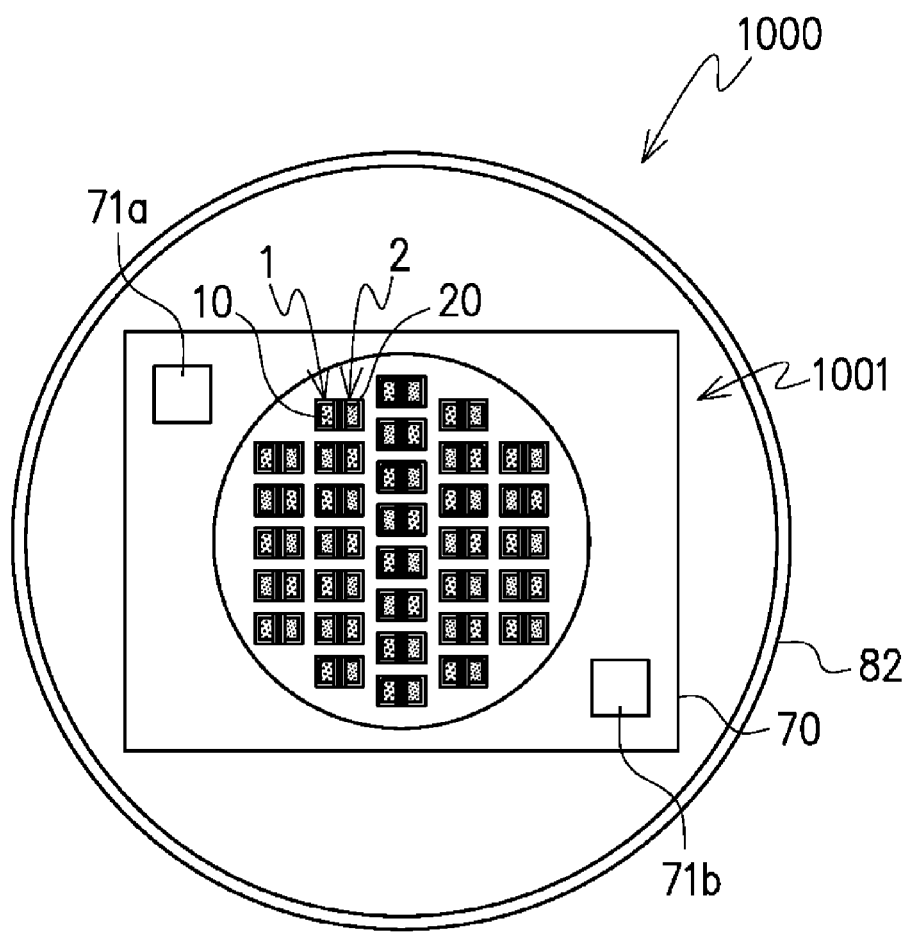
FIG. 24 shows a top plan view of the lighting device shown in FIG. 23 and with a light-transmitting cover removed.

FIG. 23 shows a lighting device according to a thirteenth embodiment of the present invention, and FIG. 24 shows a top plan view of the lighting device of FIG. 23 with a light-transmitting cover 81 removed. The lighting device 1000 has a bulb shape including a lighting device 1001 as a light source and a holder 82 supporting the light source 1001. The light source 1001 includes light-emitters including a first light emitter 1 and a second light emitter 2 arranged in an area of a substrate 60. The first light emitter 1 includes a first light-emitting element with a p-n junction and a first side cover partly covering a peripheral side surface of the first light-emitting element 10. The second light emitter 2 includes a second light-emitting element with a p-n junction and a second side cover partly covering a peripheral side surface of the second light-emitting element 20. The first light emitter 1 and the second light-emitter 2 are disposed to face each other at uncovered side portions that are uncovered by the first side cover and the second side cover. Pairs of first light emitter 1 and second light emitter 2 may be arranged in lines that can be arranged to be parallel with each other in an area. Also, it is possible to arrange groups each including four light emitters as shown in FIG. 15 or in FIG. 18. Furthermore, it is possible to arrange groups each including six light emitters and/or groups each including more light emitters one group after another group in an area. The area where the light emitters are arranged can be a circular area or square area. The light emitters can be mounted on a circuit substrate 70 and electrically connected to the terminal electrodes 71*a* and 71*b* that are arranged on the circuit substrate 70.

The lighting device 1000 further includes a base that is positioned below the light emitters to supply electrical current. In this embodiment, the base may be a bayonet cap 83 that is positioned under the holder 82 and includes a pair of terminals 84*a* and 84*b*. The holder 82 may include a control circuit that can control supply of electrical current to the light-emitting elements of light emitters. Electrical current will be supplied to the first electrode 71*a* and the second electrode 71*b* arranged on the circuit substrate 70 through the terminals 84*a* and 84*b* from outside.

The light-transmitting cover 81 can have a semispherical shape. The light-transmitting cover 81 may be made of glass and/or resin.

Furthermore, while certain embodiments of the present inventive subject matter have been illustrated with reference to specific combinations of elements, various other combinations may also be provided without departing from the teachings of the present inventive subject matter. Thus, the present inventive subject matter should not be construed as being limited to the particular exemplary embodiments described herein and illustrated in the Figures, but may also encompass combinations of elements of the various illustrated embodiments.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the inventive subject matter.

The invention claimed is:

1. A lighting device comprising:
   a first light emitter comprising a first light-emitting element with a p-n junction and a first side cover being directly arranged on a peripheral side surface of the first light-emitting element and partly covering the peripheral side surface of the first light-emitting element to shield and/or reflect light inward toward the first light-emitting element; and
   a second light emitter comprising a second light-emitting element with a p-n junction and a second side cover being directly arranged on a peripheral side surface of the second light-emitting element and partly covering the peripheral side surface of the second light-emitting element to shield and/or reflect light inward toward the second light-emitting element,
   wherein the first light emitter and the second light emitter are disposed to face each other at uncovered side portions that are uncovered by the first side cover and the second side cover.

2. The lighting device according to claim 1,
   wherein the first light emitter and the second light emitter are configured to emit light with emission spectrums that are different from each other.

3. The lighting device according to claim 1,
   wherein the first side cover covers a quarter or more of an area of the peripheral side surface of the first light-emitting element, and/or
   wherein the second side cover covers a quarter or more of an area of the peripheral side surface of the second light-emitting element.

4. The lighting device according to claim 1,
   wherein the first side cover is made of white resin, and/or
   wherein the second side cover is made of white resin.

5. The lighting device according to claim 4,
   wherein the white resin comprises a titanium oxide particle.

6. The lighting device according to claim 1,
   wherein the first light emitter further comprises a substrate on which the first light-emitting element is electrically mounted and a first light-transmitting layer arranged on the substrate to seal the first light-emitting element on the substrate, and the first side cover at a position opposite to the uncovered side portion that is uncovered by the first side cover is greater in height from an upper surface of the substrate than the first light-transmitting layer from the upper surface of the substrate at a position adjacent to the uncovered side portion that is uncovered by the first side cover, and/or
   wherein the second light emitter further comprises a substrate on which the second light-emitting element is electrically mounted and a second light-transmitting layer arranged on the substrate to seal the second light-emitting element on the substrate, and the second side cover at a position opposite to the uncovered side portion that is uncovered by the second side cover is greater in height from the upper surface of the substrate than the second light-transmitting layer from the upper surface of the substrate at a position adjacent to the uncovered side portion that is uncovered by the second side cover.

7. The lighting device according to claim 1,
   wherein the first light emitter further comprises a light diffusion layer arranged over at least the uncovered side portion uncovered by the first side cover, and/or
   wherein the second light emitter further comprises a light diffusion layer arranged over at least the uncovered side portion uncovered by the second side cover.

8. The lighting device according to claim 1,
   wherein the first side cover is greater in height than the second side cover, or
   wherein the second side cover is greater in height than the first side cover.

9. The lighting device according to claim 1,
   wherein the first light emitter is at least two first light emitters and the second light emitter is at least two second light emitters, and
   wherein a first pair comprising one of the first light emitters and one of the second light emitters and a second pair comprising another of the first light emitters and another of the second light emitters are arranged one after another in a line and/or arranged side by side and/or arranged in an area.

10. The lighting device according to claim 9, further comprising:
    at least two third light emitters, each of the third light emitters being positioned inside of positions of the first light emitter and the second light emitter of one of the first and second pairs arranged in the area.

11. The lighting device according to claim 10,
    wherein the first light emitters, the second light emitters, and the third light emitters are configured to emit light with emission spectrums that are different from each other.

12. The lighting device according to claim 10,
    wherein each of the third light emitters has a peripheral side surface and is configured to emit light radially from the peripheral side surface.

13. The lighting device according to claim 1, further comprising:
    a light-transmitting cover covering the first and second light emitters; and
    a base positioned below the first and second light emitters to supply electrical current to the first and second light emitters.

14. The lighting device according to claim 11,
    wherein each of the third light emitters has a peripheral side surface and is configured to emit light radially from the peripheral side surface.

15. The lighting device according to claim 7,
    wherein the light diffusion layer arranged over the at least the uncovered side portion that is uncovered by the first side cover includes a reflective particle, and/or
    wherein the light diffusion layer arranged over the at least the uncovered side portion that is uncovered by the second side cover includes a reflective particle.

16. The lighting device according to claim 1, further comprising:
    a third light emitter comprising a third light-emitting element,
    wherein the third light emitter is positioned inside of positions of the first light emitter and the second light emitter.

17. A lighting device comprising:
a first light emitter comprising a first light-emitting element and a first side cover being directly arranged on a peripheral side surface of the first light-emitting element and partly covering the peripheral side surface of the first light-emitting element to shield and/or reflect light inward toward the first light-emitting element;
a second light emitter comprising a second light-emitting element and a second side cover being directly arranged on a peripheral side surface of the second light-emitting element and partly covering the peripheral side surface of the second light-emitting element to shield and/or reflect light inward toward the second light-emitting element; and
a third light emitter comprising a third light-emitting element;
wherein the first light emitter and the second light emitter are separately arranged to face each other at uncovered side portions that are uncovered by the first side cover and the second side cover, and the third light emitter is positioned inside of positions of the first light emitter and the second light emitter.

18. The lighting device according to claim 1,
wherein the first side cover and the second side cover are free from contact with each other.

\* \* \* \* \*